(12) United States Patent
McElrath et al.

(10) Patent No.: US 7,811,542 B1
(45) Date of Patent: Oct. 12, 2010

(54) CARBON NANOTUBE PARTICULATES, COMPOSITIONS AND USE THEREOF

(75) Inventors: Kenneth O. McElrath, Houston, TX (US); Yuemei Yang, Houston, TX (US); Kenneth A. Smith, Houston, TX (US); Xiaodong Hu, Katy, TX (US)

(73) Assignee: Unidym, Inc., Menlo Park, CA (US)

( * ) Notice: Subject to any disclaimer, the term of this patent is extended or adjusted under 35 U.S.C. 154(b) by 753 days.

(21) Appl. No.: 11/531,730

(22) Filed: Sep. 14, 2006

Related U.S. Application Data

(63) Continuation of application No. 10/719,689, filed on Nov. 21, 2003, now abandoned.

(60) Provisional application No. 60/429,233, filed on Nov. 26, 2002, provisional application No. 60/429,264, filed on Nov. 26, 2002.

(51) Int. Cl.
*D01F 9/12* (2006.01)
*B82B 1/00* (2006.01)

(52) U.S. Cl. .................. 423/447.2; 977/752

(58) Field of Classification Search ........... 977/752; 423/447.2
See application file for complete search history.

(56) References Cited

U.S. PATENT DOCUMENTS

| 6,333,016 | B1 | 12/2001 | Resasco et al. | 423/447.3 |
| 6,413,487 | B1 | 7/2002 | Resasco et al. | 423/447.3 |
| 7,413,723 | B2 * | 8/2008 | Niu et al. | 423/447.3 |

FOREIGN PATENT DOCUMENTS

| EP | 1 391 425 A1 | 2/2004 |
| WO | WO00/63115 | 10/2000 |
| WO | WO02/092506 | 11/2002 |
| WO | WO03/037792 | 5/2003 |

OTHER PUBLICATIONS

Tang et al., *Chemical Physics Letters* 350:19-26 (2001).
Flahaut et al., *J. Mater. Chem.* 10:249-252 (2000).
Qingwen et al., *J. Mater. Chem.* 12:1179-1183 (2002).
Su et al., *Chemical Physics Letters* 322:321-326 (2000).
Willems et al., *Applied Catalysis A: General* 229:229-233 (2002).
Bacsa et al., *Chemical Physics Letters* 323:566-571 (2000).
Colomer et al., *Chemical Physics Letters* 317:83-89 (2000).
Bacsa et al., *J. Am. Ceram. Soc.* 85:2666-69 (2002).
Alvarez et al., *Chemical Physics Letters* 342:7-14 (2001).
Dresselhaus et al., "Carbon Nanotubes: Synthesis, Structure, Properties and Applications," Springer-Verlag, Berlin Heidelberg XP002273341, p. 32, paragraph 1.2-p. 39; p. 394, paragraph 1-p. 401; p. 406, paragraph 3-p. 412 (2001).

\* cited by examiner

*Primary Examiner*—Stuart Hendrickson
(74) *Attorney, Agent, or Firm*—Williams, Morgan & Amerson, P.C.

(57) ABSTRACT

A method for making carbon nanotube particulates involves providing a catalyst comprising catalytic metals, such as iron and molybdenum or metals from Group VIB or Group VIIIB elements, on a support material, such as magnesia, and contacting the catalyst with a gaseous carbon-containing feedstock, such as methane, at a sufficient temperature and for a sufficient contact time to make small-diameter carbon nanotubes having one or more walls and outer wall diameters of less than about 3 nm. Removal of the support material from the carbon nanotubes yields particulates of enmeshed carbon nanotubes that retain an approximate three-dimensional shape and size of the particulate support that was removed. The carbon nanotube particulates can comprise ropes of carbon nanotubes. The carbon nanotube particulates disperse well in polymers and show high conductivity in polymers at low loadings. As electrical emitters, the carbon nanotube particulates exhibit very low "turn on" emission field.

8 Claims, 11 Drawing Sheets

CARBON NANOTUBE PARTICULATES, COMPOSITIONS AND USE THEREOF

CROSS-REFERENCE TO RELATED APPLICATION

This application is a continuation of Ser. No. 10/719,689, filed on Nov. 21, 2003 now abandoned, which claims priority from U.S. provisional application Ser. Nos. 60/429,233 and 60/429,264, both filed Nov. 26, 2002, which applications are both incorporated herein by reference.

FIELD OF THE INVENTION

This invention relates generally to a method for making carbon nanotube particulates, compositions and uses thereof.

BACKGROUND OF THE INVENTION

Carbon nanotubes are a novel form of carbon. Single-wall carbon nanotubes are hollow, tubular fullerene molecules consisting essentially of $sp^2$-hybridized carbon atoms typically arranged in hexagons and pentagons. Single-wall carbon nanotubes typically have diameters in the range between about 0.5 nanometers (nm) and about 3.5 nm, and lengths usually greater than about 50 nm. They are known for their excellent electrical and thermal conductivity and high tensile strength. Since their discovery in 1993, there has been substantial research to describe their properties and develop applications using them.

Multiple-wall carbon nanotubes, also called multi-wall carbon nanotubes, are nested single-wall carbon cylinders. The number of walls in a multi-wall carbon nanotube can be as few as two (double-wall carbon nanotube) or three (triple-wall carbon nanotube) and may range up to hundreds. Multi-wall carbon nanotubes possess some properties similar to single-wall carbon nanotubes. However, as the number of walls increases, so does the number of defects. Because single-wall carbon nanotubes generally cannot accommodate defects during growth, they typically have very few defects. The minimal number of defects usually renders single-wall carbon nanotubes stronger and more conductive than multi-wall carbon nanotubes. Single wall carbon nanotubes are known to readily form into "ropes", which are aggregates of multiple parallel tubes in contact with one another. The single-wall carbon nanotubes in the ropes are cohesively held tightly together by strong van der Waals forces. Besides ropes of single-wall carbon nanotubes, ropes of small-diameter carbon nanotubes (i.e. diameters between 0.5 nm and 3 nm) have been observed with nanotubes having single and multiple walls. Such carbon nanotube ropes of small-diameter carbon nanotubes are illustrated in "Catalytic Growth of Single-Wall Carbon Nanotubes from Metal Particles," International Pat. Publ. WO 00/17102 A1, published Mar. 30, 2000. Large multi-wall carbon nanotubes, with diameters greater than about 4 nm, tend to have an increasing number of defects and decreasing electrical conductivity and tensile strength. The larger, less-flexible multi-wall carbon nanotubes also do not form "ropes".

Most methods for carbon nanotube production involve one or a combination of transition metal catalysts in contact with a carbon-containing feedstock at an elevated temperature typically between about 700° C. and 1200° C. Some of the methods to make carbon nanotubes include electric arc, laser ablation of graphite, and gas phase techniques with supported and unsupported metal catalyst.

One method of preparing carbon nanotubes on supported metal catalyst is known as "chemical vapor deposition" or "CVD". In this method, gaseous carbon-containing feedstock molecules react on nanometer-scale particles of catalytic metal supported on a substrate to form carbon nanotubes. This procedure has been used to produce multi-wall carbon nanotubes, however, under certain reaction conditions, it can produce excellent single-wall carbon nanotubes. Synthesis of small-diameter carbon nanotubes using CVD methodology has been described in Dai, et al. (1996), *Chem. Phys. Lett.*, 260, p. 471-475, and "Catalytic Growth of Single-Wall Carbon Nanotubes from Metal Particles," International Pat. Publ. WO 00/17102 A1, published Mar. 30, 2000, each incorporated herein by reference. The carbon nanotube material that results from a CVD process comprises single-wall and small-diameter multi-wall carbon nanotubes, residual catalyst metal particles, catalyst support material, and other extraneous carbon forms, which can be amorphous carbon, and non-tubular fullerenes. The term "extraneous carbon" will be used herein as any carbon that is not in the form of carbon nanotubes, and can include graphene sheets, non-tubular fullerenes, partial nanotube forms, amorphous carbon and other disordered carbon.

Many end-use applications for carbon nanotubes require that the nanotube material be effectively dispersed in another medium such as a liquid solvent solution or molten material in order to form a composite comprising nanotubes and a matrix material which can be polymeric, metallic, organic, inorganic or combinations thereof. When carbon nanotubes are dispersed in a matrix material, the physical, electrical, chemical and thermal properties of the composite material can be different compared to those of the matrix material alone. The properties of the nanotube composites depend, in part, on the concentration of nanotubes in the composite and on the diameter, length and morphology of carbon nanotubes in the matrix material. For example, when blending carbon nanotubes in liquids, the length distribution of the nanotubes can affect the viscosity characteristics of the liquid/nanotube mixture. The properties of the composite are highly dependent on how effectively the carbon nanotubes are dispersed in the composite. There is a substantial need for carbon nanotube materials that can easily be dispersed in matrix materials, and particularly those that can be dispersed by commercially-effective methods such as melt blending. Additionally, there is a need for a carbon nanotube material that is stable in oxidative environments at high temperatures, such as up to about 550° C.

SUMMARY OF THE INVENTION

In one embodiment, the invention involves carbon nanotube particulates, a method for making the same, compositions and uses thereof. One embodiment is a carbon nanotube particulate that comprises a plurality of small-diameter carbon nanotubes arranged in a 3-dimensional network in the carbon nanotube particulate. The carbon nanotube particulate has a cross-sectional dimension of less than about 1000 microns and the small-diameter carbon nanotubes have a diameter in the range of about 0.5 nm and about 3 nm. The carbon nanotube particulates can be a 3-dimensional network of inter-twined and interconnected carbon nanotubes, wherein the particulates have a macroscopic particulate morphology with a cross-sectional dimension of less than about 1000 microns. The carbon nanotubes in the particulates can be single-walled, double-walled, triple-walled, quadruple-walled or a combination thereof. The method for producing carbon nanotube particulates, comprises providing a catalyst comprising catalytic metal on a particulate support, wherein the particulate support has a cross-sectional dimension of less than 1000 microns, and contacting the catalyst with a gaseous stream comprising a carbon-containing feedstock at a sufficient temperature and for a contact time sufficient to make a carbon product on the catalyst wherein the carbon product comprises carbon nanotube particulates, wherein the carbon nanotube particulates comprise carbon nanotubes having diameters in the range of about 0.5 nm and about 3 nm.

In another embodiment, a method for producing carbon nanotube particulates comprises (a) providing a catalyst comprising catalytic metal on a particulate support, wherein the particulate support has a cross-sectional dimension of less than about 1000 microns, (b) contacting the catalyst with a gaseous stream comprising a carbon-containing feedstock at a sufficient temperature and for a contact time sufficient to make a carbon product on the catalyst wherein the carbon product comprises carbon nanotube particulates, wherein the particulates comprise small-diameter carbon nanotubes, wherein the small-diameter carbon nanotubes have a outer diameter in the range of about 0.5 nm and about 3 nm, and (c) removing the particulate support from the carbon product comprising the carbon nanotube particulates, wherein the carbon nanotube particulates retain a macroscopic morphology of an approximate shape and an approximate cross-sectional dimension as before removal of the particulate support. In the process of removing the support, the catalyst metal, or a portion thereof, can be removed. The carbon nanotube particulates, after removal of the catalyst support, retain the macroscopic morphology that approximates the shape, size and cross-sectional dimension comparable to that of the removed particulate support. The support can comprise a material selected from the group consisting of zeolite, silica, alumina, zirconia, magnesia and combinations thereof. The catalytic metal can comprise at least one element selected from the group consisting of chromium, molybdenum, tungsten, iron, cobalt, nickel, ruthenium, rhodium, palladium, osmium, iridium, platinum, a lanthanide series element, an actinide series element, and combinations thereof. In one embodiment, the carbon nanotube particulates have a bulk density in a range between about 0.01 g/cm$^3$ and about 0.5 g/cm$^3$. The particulate support typically has a cross-sectional dimension in the range between about 0.1 micron and about 1000 microns. In another embodiment, the carbon nanotube particulates have a cross-sectional dimension in the range between about 0.1 and about 1000 microns.

In another embodiment, the carbon nanotubes are present in the carbon nanotube particulate in an amount greater than about 50 wt % of a total weight of the carbon product, preferably greater than about 80 wt % of a total weight of the carbon product, and preferably greater than about 90 wt % of a total weight of the carbon product. Carbon nanotubes can span between the carbon nanotube particulates.

In another embodiment, the surface area of the carbon nanotube particulate is in the range between about 10 m$^2$/g and about 1000 m$^2$/g, and is preferably between 100 m$^2$/g and about 1000 m$^2$/g.

In one embodiment, the carbon nanotube particulates comprise carbon nanotube ropes of small-diameter carbon nanotubes wherein the nanotubes can be single-walled, double-walled, triple-walled, or in some cases, quadruple-walled, such that the diameter of the outer walls of the nanotubes are less than about 3 nm, generally in the range between about 0.5 nm and about 3 nm. The carbon nanotube particulates can comprise ropes of carbon nanotubes, wherein the cross-sectional dimension of the ropes are in the range of about 10 nm and about 50 nm. The nanotube particulates can also comprise carbon nanotube ropes of small-diameter nanotubes, wherein the ropes have a cross-sectional dimension less than about 10 nm.

In another embodiment, the carbon nanotubes are present on the surface of the carbon nanotube particulates in a number density greater than 10 carbon nanotubes/µm$^2$. The carbon nanotube particulates can be annealed to form annealed carbon nanotube particulates that have increased thermal stability in oxidizing environments (such as exposure to air at elevated temperatures). The annealing can be done by maintaining the carbon nanotube particulates in nitrogen or an inert gas environment at a temperature between about 800° C. and 1500° C. for a time in the range of about 1 and about 24 hours. The annealed carbon nanotube particulates are stable in air at temperatures greater than about 400° C., preferably greater than about 450° C., preferably greater than about 500° C., and preferably greater than about 550° C.

In another embodiment, the carbon nanotube particulates are blended with a matrix material selected from the group consisting of polymers, metals, inorganic materials, organic materials and combinations thereof to form composites of carbon nanotube particulates in matrix materials. The carbon nanotube particulates in matrix materials can be present in the composite in a range of about 0.001 wt % and about 50 wt %.

In another embodiment, an carbon nanotube particulate electron emitter comprises a carbon nanotube particulate on a surface wherein the carbon nanotube particulate comprises entangled small-diameter carbon nanotubes wherein the small-diameter nanotubes have an outer diameter in a range of about 0.5 nm and about 3 nm, wherein the carbon nanotube particulate has a cross-sectional dimension in a range of about 0.1 micron and about 100 microns, preferably in the range of about 0.1 micron and about 3 microns. The carbon nanotubes are selected from the group consisting of single-walled carbon nanotubes, double-walled carbon nanotubes, triple-walled carbon nanotubes, quadruple-walled carbon nanotubes and combinations thereof. The carbon nanotube particulate emitter is suitable for use as a cathode component in field emission devices.

In another embodiment, a method for making a carbon nanotube particulate electron emitter, comprises (a) providing a carbon nanotube particulate wherein the carbon nanotube particulate comprises entangled small-diameter carbon nanotubes, wherein the small-diameter nanotubes have an outer diameter in a range of about 0.5 nm and about 3 nm, wherein the carbon nanotubes are selected from the group consisting of single-walled carbon nanotubes, double-walled carbon nanotubes, triple-walled carbon nanotubes, quadruple-walled carbon nanotubes and combinations thereof, and wherein the carbon nanotube particulate has a cross-sectional dimension in a range of about 0.1 micron and about 100 microns, preferably about 0.1 and about 3 microns, and (b) depositing the carbon nanotube particulate on a surface. The carbon nanotubes can be activated by etching means.

DESCRIPTION OF THE DRAWINGS

FIG. 1A shows the catalyst incorporating carbon nanotubes after it has been subjected to the growth process described in Example 1. FIG. 1B shows the carbon nanotube product of the growth process after purification by acid treatment as described in Example 1. Comparison of FIGS. 1A and 1B shows that the morphology of the support is retained in the purified nanotube material and shows the particulate nature of the invention.

FIG. 2A shows the carbon nanotubes on the catalyst support after the nanotubes were grown according to procedures described in Example 1.

FIG. 2B shows the carbon nanotube product of the present invention after purification by acid treatment as described in Example 1. Comparison of FIGS. 2A and 2B shows that the morphological form of the support is retained in the purified nanotube material.

FIG. 3 shows the density of carbon nanotube ropes on the particulate surface. The image indicates that the population density of carbon nanotubes exceeds 10 per square micron.

FIG. 4A is a transmission electron micrograph (TEM) and FIG. 4B is a SEM. Both micrographs show the nanotube particulate material and ropes of carbon nanotubes spanning between nanotube particulates.

DETAILED DESCRIPTION OF SPECIFIC EMBODIMENTS

Figure 1:
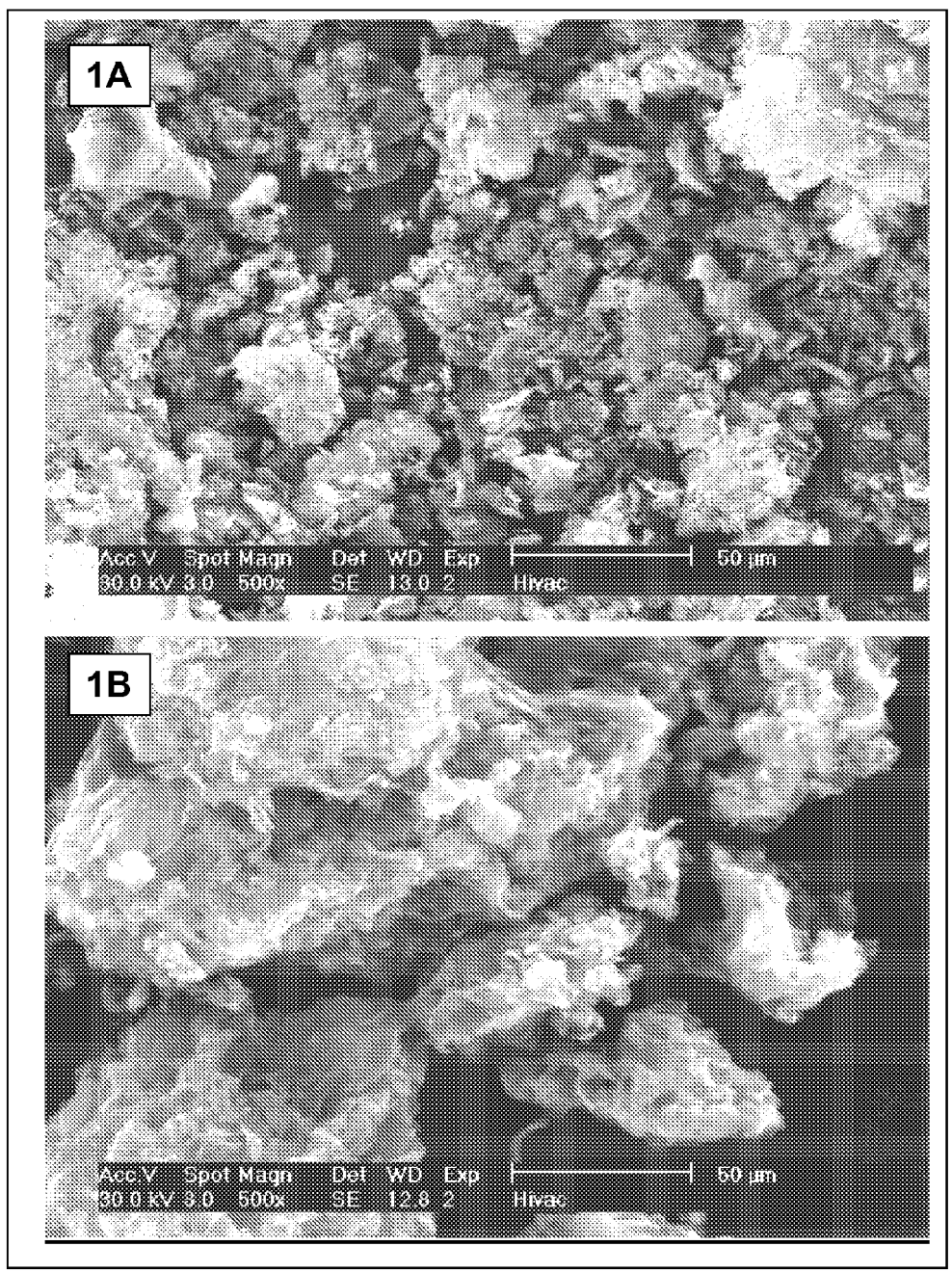
FIGS. 1A and 1B are scanning electron micrographs (SEMs) of one embodiment of the present invention at 500× magnification.

The present invention provides a method for making carbon nanotube particulates comprising growing carbon nanotubes on a catalyst metal residing on a particulate support, wherein the carbon nanotube particulates comprise small-diameter carbon nanotubes with diameters less than about 3 nanometers and wherein the carbon nanotube particulates have approximately the same size and approximately the same shape as the particulate support. The small-diameter carbon nanotubes comprise both single-wall carbon nanotubes, and nanotubes having several walls, such as two, three or four walls.

The following definitions will apply.

"Catalyst" shall mean the complete catalyst system including all components that make up the system, such as the catalytic metal, compounds of the catalytic metal, the support material, and any other components and/or treatments that might be included in an embodiment. The term "catalyst", "supported catalyst", and "catalyst particulate" are intended to have the same meaning in the present application.

"Catalytic metal", "catalyst metal" or "metal catalyst" shall mean the transition metal or combination of transition metals that catalyzes the reaction of the carbon-containing feedstock to carbon nanotubes. The catalytic metal is part of the catalyst.

"Support material" is a material that can withstand the reaction temperatures and conditions for making carbon nanotubes. The support material is part of the catalyst and provides a surface for the catalytic metal to reside upon. The support material can be in particulate form and may be referred to as "particulate support."

A "small-diameter carbon nanotube" is a carbon nanotube that can have one or more walls, with an outer wall having a diameter of less than about 3 nanometers.

In one embodiment, the carbon nanotube particulates comprising small-diameter carbon nanotubes are made by providing a catalyst comprising catalytic metals, iron (Fe) and molybdenum (Mo), and magnesium oxide (MgO) support material, wherein the catalyst is formed by combusting precursors of iron, molybdenum and magnesium oxide. In this embodiment, the carbon nanotubes are produced by contacting the catalyst with a gaseous carbon-containing feedstock at a sufficient temperature and for a contact time sufficient to make a carbon product comprising small-diameter carbon nanotubes, wherein the carbon nanotubes can have one or more walls and wherein the carbon nanotubes have outer wall diameters that are less than about 3 nm.

In one embodiment, the supported catalyst is prepared by combining precursors of the iron, molybdenum and magnesium oxide in a container able to withstand combustion temperatures. Any iron compound that can be combusted to iron oxide is a suitable iron precursor. Examples of suitable iron precursors include, but are not limited to, iron (III) nitrate, iron sulfite, iron sulfate, iron carbonate, iron acetate, iron citrate, iron gluconate, iron hexacyanoferrite, iron oxalate, and tris(ethylenediamine) iron sulfate. Generally, iron salts with high water solubility are preferred. Hydrated iron (III)

nitrate is a preferred iron precursor. Any molybdenum compound that can be combusted to molybdenum oxide is a suitable molybdenum precursor. An example of a suitable precursor for molybdenum is ammonium heptamolybdate tetrahydrate. Generally, molybdenum salts with high water solubility are preferred. Any magnesium compound that can be combusted to magnesium oxide is a suitable magnesium oxide precursor. An example of a suitable magnesium oxide precursor is magnesium nitrate. The amount of each precursor is determined such that the weight ratio of iron to molybdenum ranges between about 2 to 1 and about 10 to 1, preferably in the range between about 5 to 1 and about 10 to 1. Preferably, the amount of iron is greater than the amount of molybdenum, on either a weight or a molar basis. On a molar basis, the amount of each precursor can be selected such that the iron to molybdenum mole ratio ranges from about 3 to 1 to about 20 to 1.

The metal loading on the magnesium oxide support is selected to be in a range conducive primarily to the growth of small-diameter carbon nanotubes. Metal loading has been defined herein as the percentage of metal weight on the total weight of the support material. The amount of each precursor is also determined such that the total weight of the metal on the magnesium oxide formed in the combustion is in the range of about 0.05 wt % and about 20 wt % of the weight of the magnesium oxide, preferably in the range of about 0.05 wt % and about 10 wt % of the weight of the magnesium oxide, and more preferably in the range of about 0.05 wt % and about 5 wt % of the weight of the magnesium oxide.

The present method of catalyst preparation is not limited to use of the elements recited above. The catalyst support can be any metal oxide that can withstand the conditions present in the growth environment for the carbon nanotubes. Such metal oxides include, but are not limited to, zeolites, alumina ($Al_2O_3$), silica ($SiO_2$), magnesia (MgO), zirconia ($ZrO_2$), and combinations thereof. The catalytic metal can comprise one or a combination of metals from Group VIB transition metals, (chromium (Cr), molybdenum (Mo), tungsten (W)), Group VIIIB transition metals, (e.g., iron (Fe), cobalt (Co), nickel (Ni), ruthenium (Ru), rhodium (Rh), palladium (Pd), osmium (Os), iridium (Ir) and platinum (Pt)), the lanthanide series elements, and actinide series elements. Preferably, the catalyst comprises a combination of catalytic metals; more preferably, the catalyst comprises a combination of at least one metal from Group VIB and at least one metal from Group VIIIB.

Catalyst preparation is not limited to the combustion method described herein. In another embodiment, the catalyst may be formed by co-precipitation of the catalyst support and the catalytic metal or metal combination. In this embodiment, catalyst support precursors and catalytic metal precursors are mixed in solution. The solution is then treated, such as by changing pH, temperature, and/or composition, to precipitate catalyst components, including a catalyst support and catalytic metal or compounds comprising the catalytic metal. The precipitate is then removed from the solution by means of liquid/solid separation, such as, but not limited to, decantation, filtration, centrifugation or combinations thereof. The separated solids can be treated by heating in air or another gaseous environment to create the final catalyst composition. This final composition may be made into catalyst particulates by any physical means, such as, but not limited to, pulverizing, grinding or other mechanical means. A size distribution for the catalyst particulates can be obtained by screening the particulates and recovering the desired size distribution.

In another embodiment, the catalyst can be made by incipient wetness or impregnation. In this method, a particulate support material is contacted with a small amount of liquid solution or suspension comprising one or more chemical species comprising the catalytic metal or metals. The liquid is then evaporated, preferably using a rotary evaporator, such that the catalytic metal or metal precursors are left residing on the surface of the particulate support.

In another embodiment, the catalyst can be made by ion exchange. In this method, a particulate support material having surface cations, such as zeolites, is mixed with a solution of a catalytic metal salts. The metal ions of the catalytic metal salts exchange with surface cations on the support. The metal-loaded support is then filtered from the solution and dried. The dried metal-loaded support can be ground into particulates and sized by screening. The metal-containing species on the surface of the support material can be reduced to metal particles by exposure to hydrogen at temperatures above about 200° C. or by other reducing means. The reduction of the metal species can be done before loading the catalyst into the reactor to make nanotubes or while in the reactor for making nanotubes.

In another embodiment of the present invention, the catalyst for making small-diameter carbon nanotubes can comprise the catalytic metals cobalt and molybdenum, and magnesium oxide support material, wherein the catalyst is formed by combusting precursors of cobalt, molybdenum and magnesium oxide.

In certain embodiments of the present invention, the catalytic metal in the catalyst composition may be chemically incorporated in the support material. These compositions are sometimes referred to as solid solutions, an example of which is $Fe_xMg_{(1-x)}O_n$, where $0<x<1$, and $0<n\leq 4$.

In combustion methods of catalyst preparation, the catalyst component precursors are combined prior to combustion. Preferably the component precursors are well mixed. The mixing can be done by any mixing means, such as by grinding the components with a mortar and pestle and physically mixing the components. Another way of mixing can be by dissolving the precursors in a small amount water, preferably deionized water, and making a solution of the precursors. Citric acid, urea, glycine, hydrazine, sucrose, carbohydrazide, oxalyl dihydrazide, sugars, alcohols, or a combination thereof, can be used in combustion as foaming promoters. Foaming promoters, also called fuels, are used to increase the surface area of the resulting catalyst. Any foaming promoter can be mixed with the catalyst precursors prior to or after mixing with the water. Preferably, citric acid is added to the catalyst precursors. After combining and mixing the precursors and any foaming promoters, the components are subjected to combustion at a temperature above the combustion temperature of each of the catalyst precursors. Generally, the combustion of the catalyst precursors is conducted by exposing the catalyst precursors to a temperature in the range of about 150° C. and about 1200° C. Typically, the precursors are exposed to combustion temperatures the range of about 200° C. and about 750° C., preferably in a range of about 250° C. and about 650° C. The combustion is conducted in an oxidative environment, preferably in an atmosphere comprising oxygen, such as air. During combustion, the catalyst precursors rapidly foam and form a low bulk density, high surface area solid. In one embodiment, the combustion can be done by preparing a solution of the catalyst precursor components, placing the solution of catalyst precursors in a heated oven, wherein the precursors dry as the solvent evaporates, after which the precursors combust.

In another embodiment, the solution of catalyst precursors is sprayed to form an aerosol into a heated chamber, such as a drier, oven or spray drier. The aerosol may be produced by any means of spraying, such as, but not limited to, atomization by a flow of gas, direct spraying of the solution through a nozzle, electrostatic spraying, dispersing the solution from the surface of a rotating fixture, and combinations thereof. In another embodiment, the catalyst precursors are combusted by putting the solution of catalyst precursors on a heated surface, whereon the solvent evaporates, and, after which the catalyst precursors combust and the resulting solid material is removed from the surface. Apparatus useful in scale-up combustion done on a heated surface include, but is not limited to, porcupine reactors, drum flakers, wiped-film evaporators and similar process equipment. After combustion, the solid product can be further heated to ensure complete combustion and metal salt decomposition. Generally, about an hour at the combustion temperature is a suitable time, although times up to 24 hours may be used. After combustion, the solid, which is generally of low density and high surface area, is cooled. Preferably, the cooling is done in a dry, inert atmosphere, such as provided by a dry nitrogen purge or a desiccator. After cooling, the solid can be in particulate form and/or ground into small particulates, by various means, such as, but not limited to grinding, milling, pulverizing and combinations thereof to achieve particulates of the desired size. Further sizing of the particulates can be done by screening the particulates with screens of different meshes.

In one embodiment, the preferred size of the catalyst particle depends on the reactor configuration selected. For some reactors, the preferred cross-sectional dimension of the catalyst particle is less than about 1000 microns, for other reactor configurations, the preferred catalyst particle size will be less than about 100 microns; for yet other reactor configurations, the preferred cross-sectional dimension of the catalyst particle is less than about 30 microns. Since the catalyst particulate size directly affects the size of the carbon nanotube particulate, the size of the catalyst particle can be selected based on the desired carbon nanotube particulate size for a particular end-use. The bulk density of the catalyst is typically less than about 0.3 g/cm$^3$, and preferably less than about 0.1 g/cm$^3$.

Prior to using the catalyst to produce carbon nanotubes, the catalytic metals of the catalyst can be in oxide form, such as iron oxide and molybdenum oxide supported on magnesium oxide. In one embodiment, the catalyst can be treated with a sulfur-containing compound prior to its use in carbon nanotube production. The treatment can be done with any sulfur-containing compound, preferably a sulfur-containing compound that is a gas or a compound that can be volatilized and contacted with the catalyst in gaseous form. Examples of suitable sulfur-containing compounds are thiophene, hydrogen sulfide, mercaptans and combinations thereof. Thiophene is a preferred sulfur-containing compound to treat the catalyst. To treat the catalyst with a sulfur-containing compound, the catalyst is loaded into an apparatus wherein the catalyst can be heated and wherein the sulfur-containing compound can pass through the catalyst. For example, a suitable apparatus is a tubular reactor, such as a quartz tube, wherein the reactor is mounted vertically in a tubular furnace and wherein the reactor has a porous frit to position the catalyst in the heated portion of the tubular reactor. Gas, introduced at the bottom of the reactor, passes up through the reactor, through the frit, through the catalyst and exits out through the top of the reactor. With suitable gas flow, the catalyst can be fluidized with the upward flowing gas. In one embodiment, the catalyst in oxide form is treated with a sulfur-containing compound by loading the catalyst into the reactor, purging the reactor containing the catalyst with nitrogen or an inert gas, such as argon, heating the reactor to a temperature, such as to about 500° C., allowing the flow of nitrogen or inert gas to pass through a sulfur-containing compound, such as thiophene in a bubbler, prior to its entry into the reactor, such that the nitrogen or inert gas entering the reactor contains at least some sulfur-containing compound. The gas containing the sulfur-containing compound is then passed into the reactor and through the heated catalyst. The sulfur treatment of the catalyst is conducted at a suitable temperature, such as about 500° C., for a length of time, such as, for example, about 10 minutes.

In an alternate embodiment, the sulfur-containing compound may be added to a gas comprising the gaseous feedstock to form a sulfur-containing compound/feedstock mixture, and this mixture can subsequently be introduced to the reactor under reaction conditions that produce small-diameter carbon nanotubes.

If the catalytic metals are in the form of metal oxides, the catalytic metal oxides can be activated to catalytically active sites for the formation of small-diameter carbon nanotubes. Activation can be done by reduction of the metal oxides with a reducing agent, such as with hydrogen. The reduction may be done prior to, or concurrent with, contacting the catalyst with the carbon-containing feedstock to make small-diameter carbon nanotubes.

In one embodiment, the oxidized catalytic metals are reduced prior to introducing the carbon-containing feedstock to the supported catalyst to make carbon nanotubes. Catalytic metals in the oxide form (with or without sulfur-treatment) can be reduced in a reactor, such as a tubular reactor. Prior to reduction, the catalyst can be purged with nitrogen or an inert gas, such as argon. Under a purge of nitrogen or an inert gas, the reactor temperature is raised to about 500° C. Catalytic metal reduction is done using a reducing agent such as hydrogen gas or a mixture of hydrogen gas and nitrogen or an inert gas. The catalyst can be treated with a reducing agent for a time sufficient to activate the catalyst, such as, for example, about 10 minutes at 500° C. using a 10% $H_2$ in argon mixture. The reduction time and temperature are inversely related, in that higher reduction temperatures would reduce the catalytic metal in a shorter time. Exposure of the catalyst to excessively long reduction times or high temperatures may cause the catalytic metal to agglomerate into large particles that could catalyze the formation of large-diameter multi-wall carbon nanotubes with outside diameters greater than about 4 nm during nanotube production.

In another embodiment, the catalytic metal oxides are reduced to activate the catalyst during the introduction of the carbon-containing feedstock to the catalyst to make nanotubes. In such a case, the catalyst is loaded into a reactor and purged with nitrogen or an inert gas, such as argon. While under a nitrogen or inert gas purge, the temperature is ramped up to a temperature at which small-diameter carbon nanotubes can form. Typically, the temperature for forming small-diameter carbon nanotubes is in the range of about 500° C. and about 1500° C., preferably in the range of about 650° C. and about 1100° C., and more preferably in the range of about 800° C. and about 950° C. Once the nanotube formation temperature is reached, the gaseous carbon-containing feedstock is introduced to the catalyst. Suitable carbon-containing feedstock gases include, but are not limited to, methane, hydrocarbons, alcohols, carbon monoxide and combinations thereof. The hydrocarbons may be aromatic, such as benzene, toluene, xylene, cumene, ethylbenzene, naphthalene, phenanthrene, anthracene or mixtures thereof. The hydrocarbons may be non-aromatic, such as methane, ethane, propane, ethylene, propylene, acetylene or mixtures thereof. The hydrocarbons may contain oxygen such as formaldehyde, acetaldehyde, acetone, methanol, ethanol or mixtures thereof. Preferably, the gaseous carbon-containing feedstock comprises methane. Introduction of gaseous carbon-containing feedstock to the catalyst at elevated temperatures can reduce the catalytic metal and activate the catalyst. The gaseous carbon-containing feedstock can also be mixed with hydrogen prior to being introduced to the catalyst. Preferably, the gaseous carbon-containing feedstock comprises methane and hydrogen.

In the event that the feedstock comprises a mixture of gases, the gas mixture may be varied during the reaction process. Varying the gas composition during the reaction process can be used to tailor the production of product to achieve specific carbon nanotube properties, such as, a particular distribution of carbon nanotube length, diameter, and/ or ratio of single-wall nanotubes to small-diameter carbon nanotubes with more than one wall.

The support material is selected to be able to withstand the elevated temperatures required for small-diameter carbon nanotube synthesis. Magnesium oxide is a preferred support material because of its low cost, ease of production, ease of being carried in a gas flow, and ease of removal from the carbon nanotube product.

The catalyst of the present invention can absorb gases, such as carbon dioxide and moisture, from the ambient air. Depending on the exposure time and conditions, the catalyst weight can increase up to about 8 wt % due to adsorbed species that can be desorbed at moderate temperatures, such as between about 100° C. and about 200° C. In certain embodiments, the catalyst support may react with air, and convert some of the support to hydroxide compounds. Such absorbed materials and chemically-modified supports can interfere with the small-diameter carbon nanotube growth process. For instance, water vapor from water desorption or decomposition of hydroxides reacts with carbon at elevated temperatures, and as such, could react with and decompose the formed carbon nanotubes. Thus, in one embodiment of this invention, the catalyst is kept under a dry, inert atmosphere, such as nitrogen or argon before being used to make small-diameter carbon nanotubes. In another embodiment, the catalyst is dried in a dry, inert atmosphere, such as nitrogen or argon, prior to using it for making small-diameter carbon nanotubes. Temperatures in the range of about 100° C. up to about 800° C. can be used to remove most absorbed species from the catalyst. Vacuum can also be used with or without heat to remove absorbed species from the catalyst.

After preparing the catalyst, the catalyst is contacted with a gaseous stream comprising a carbon-containing feedstock at a sufficient temperature and for a contact time sufficient to make a carbon product comprising small-diameter carbon nanotubes. In one embodiment, the gaseous stream also comprises hydrogen. In another embodiment, the contact time for growing small-diameter carbon nanotubes is in the range of about 0.1 seconds and about 60 minutes, preferably about 0.1 seconds to about 30 minutes. Preferably, short growth times, such as with contact times less than 30 minutes, are used to produce small-diameter carbon nanotubes; more preferably, the contact time is in the range of about 10 seconds and about 10 minutes. By varying the contact time, small-diameter carbon nanotubes can be grown to different lengths. The contact time and temperature can also affect the diameter of the small-diameter carbon nanotubes grown. The growth rate of small-diameter carbon nanotubes on the catalyst depends, among other factors, on feedstock type, concentration and temperature. The physical length of small-diameter carbon nanotubes grown under conditions appropriate to a specific growth rate depends on the duration of these conditions. Short duration exposure to growth conditions will produce nanotubes that are physically shorter than those produced by long duration exposure. Short duration exposure to growth conditions also yields a material comprising a larger fraction of single-wall carbon nanotubes. In the present invention, different distributions of length, diameter, and numbers of walls of small-diameter carbon nanotubes in the carbon product can be produced by exposure of the supported catalyst to growth conditions for different lengths of time.

Additionally, the contact time, reaction temperature, and composition and pressure of the gas with which the active catalyst is contacted in the reactor also determine the distributions of diameter, length and number of walls of the small-diameter carbon nanotubes formed and the relative amounts of small-diameter carbon nanotubes and extraneous carbon produced in the reactor. The relative amounts of carbon-containing feedstock and other gases, such as hydrogen, in the reactor can affect the small-diameter carbon nanotube product. For example, more hydrogen in the carbon-containing feedstock reduces the amount of extraneous carbon in the product. Without being limited by theory, the dynamics of carbon nanotube formation appear to be dependent on the concentration and rate of supplying carbon feedstock to the catalyst to form the carbon nanotubes. If the concentration or rate of supplying the feedstock is too high, more amorphous forms of carbon are produced relative to the formation of small-diameter carbon nanotubes. Additionally, the rate of forming small-diameter carbon nanotubes appears to be correlated to the defect level in the nanotube structure. For example, low levels of defects in the small-diameter carbon nanotube structure are generally associated with low rates of formation. Conversely, more structural defects are associated with high rates of formation. The rate of forming carbon nanotubes is highly dependent on the temperature and the partial pressure of the gaseous feedstock. The partial pressure can be controlled, in part, by adjusting the amount of diluent, such as nitrogen or an inert gas, supplied to the reactor. Adding oxidizing agents such as very low concentrations of oxygen, water vapor and carbon dioxide also serves to moderate the reaction rate, as well as, minimizes the production of extraneous carbon. However, controlling the hydrogen partial pressure in the reactor is particularly effective in controlling the rate of nucleation and growth of carbon nanotubes and extraneous carbon, with lower relative amounts of extraneous carbon being associated with higher hydrogen partial pressures in the reactor.

Modification of the nanotube nucleation process, in turn, can affect the diameter and wall-number distribution of the small-diameter carbon nanotubes. Addition of hydrogen or other gases at rates that can vary during the reaction process or addition of such gases at different locations in the reactor enables further control over the relative amounts of small-diameter carbon nanotubes and amorphous carbon, as well as control over the diameter and wall-number distributions of the small-diameter carbon nanotubes produced.

In yet another embodiment, the diameter and wall-number distributions of the nanotubes produced are controlled by the conditions during the initiation (or nucleation) of nanotube growth. These conditions include, but are not limited to, nucleation time, temperature, feedstock gas composition and pressure in the region where small-diameter carbon nanotube nucleation takes place and reactor configuration. Nanotube nucleation on the catalytic metal carried out under conditions independent from nanotube growth provides greater control over the diameter and number of walls of the nanotube.

Small-diameter carbon nanotube growth can be done by various production methods, such as in a batch process, semi-continuous or continuous modes of operation. The continuous and semi-continuous modes of operation comprise the steps of (1) dispersing the catalyst in a gaseous stream comprising a carbon-containing feedstock, (2) making small-diameter carbon nanotubes on the catalyst at a suitable temperature and for a suitable length of time, and (3) removing the nanotube product from the gaseous stream.

In one embodiment, the catalyst for growing small-diameter carbon nanotubes has a particle size in the range suitable for transport through a reactor, typically having a cross-sectional dimension in the range between about 0.1 micron and about 1000 microns. The catalyst is then introduced into the reactor such that the catalyst is carried through the reactor, which may comprise various zones that are maintained at different reaction conditions, each separately optimized for different stages of nanotube initiation and growth. Reaction conditions include, but are not limited to, reaction time, temperature, pressure and concentrations of components of gas in the reactor. Because production of small-diameter carbon nanotubes can be a multistep process, which, for example, can involve catalyst metal reduction to activate the catalyst, initiation of nanotube growth, and continuation of the nanotube growth, a desirable reactor configuration is one having different zones wherein the catalyst is conveyed or transported from one reaction zone to another. In a reactor with one or more zones, the reaction temperature and the gas composition can be adjusted within a zone of the reactor. For example, feedstock gas or other gases, such as hydrogen, catalyst, and/or heat can be added continuously or on-demand in each zone of the reactor.

The residence time of the catalyst in the reactor, i.e., the length of time the catalyst is exposed to one or more different reaction conditions through the reactor, can be controlled by adjusting, among other variables, the flow rate of the gas through the reactor and the reactor configuration. The characteristics of the small-diameter carbon nanotube product produced are controlled, by adjusting, among other variables, the residence time of the catalyst in the reactor, the temperature profile, and the composition of the gaseous stream comprising the carbon-containing feedstock. The product characteristics include, but are not limited to, the relative amounts of extraneous carbon and small-diameter carbon nanotubes, and the distributions of diameter, lengths and number of walls of the nanotubes produced.

Transporting the catalyst through the reactor provides a scalable, high-volume nanotube production process in which catalyst is continuously introduced at one point in the reactor system and product comprising small-diameter carbon nanotubes is removed continuously at another point. This continuous scheme for production of small-diameter carbon nanotubes can be done in a production plant comprising a catalyst formation section, a reactor section, and a post-processing section joined together in a single plant. After the post-processing section, other modifications to the product can be done, such as, but not limited to, oxidative treatment of the product, removal of the catalyst support and catalytic metal residues, chemical modification of the nanotubes, physical modification of the nanotubes, blending or mixing the nanotubes with other materials, and combinations thereof.

The catalyst can be transported through a reactor for making small-diameter carbon nanotubes by mechanical means, such as by screws or conveyors, however, entrainment in a gaseous stream comprising a carbon-containing feedstock is a preferred means of transport. To transport the catalyst by its entrainment in a gaseous flow, the catalyst particles are made into sufficiently finely-divided particles of a size that can be transported in a gas flow in the reactor. The catalyst is introduced at one point in the reactor, and carried through a number of zones. At least one zone will provide reaction conditions for the growth of small-diameter nanotubes and other zones may include one or a combination of a nucleation zone where growth of the small-diameter carbon nanotubes is initiated, other nanotube growth zones, and a recovery zone where the product is removed from the gaseous stream comprising unreacted feedstock, byproduct gases and transport gases exiting the reactor. One means of removal of the carbon product from the gaseous stream can be done by collecting the product on a filter which is permeable to the gaseous stream exiting the reactor. The product can also be removed from the gaseous stream exiting the reactor by other means of gas-solid separation, such as, but not limited to, a cyclone, wet scrubber, electrostatic precipitation, bag collection, and combinations thereof.

In one embodiment of the present invention, the size of the catalyst particle is selected in order to be easily entrained in a flowing gas so as to effectively grow small-diameter carbon nanotubes. For certain reactor designs, the catalyst particle can be less than about 100 microns in cross-sectional dimension and other reactor designs, less than about 30 microns in cross-sectional dimension. For some reactor conditions, the optimal-sized particles can be made by aggregating smaller particles to a size sufficient for effective reactor operation, such as in a fluidized bed or fluidized suspension. Particle aggregation can be done by various means, such as by physical aggregation, compression, pelletization, extrudation and combinations thereof. Particle aggregation can be done with or without a binder material, such as a hydroxide of the metal whose oxide forms the catalyst support.

In one embodiment of this invention, a gas stream comprising a gaseous carbon-containing feedstock transports the catalyst through one or more zones or sections of a reactor wherein each zone has controls for adjusting the conditions for small-diameter carbon nanotube production. In another embodiment, a gas stream containing nitrogen or an inert gas such as argon is used to transport the catalyst through a heating zone such that the catalyst reaches a preferred temperature before encountering the gaseous carbon-containing feedstock. The preferred temperature will generally be in a range of about 800° C. and about 1000° C. In another embodiment, the reactor is configured so that essentially-inert, non-catalytic refractory particles are optionally added to the reactor. These non-catalytic particles can provide for a more uniform dispersion of the catalyst within the flowing gas, maintain a clear path for the flow of catalyst, minimize the sticking and buildup of catalyst and nanotube product on the reactor walls, provide thermal stability (i.e. by providing a heat reservoir or heat sink for endothermic or exothermic reactions, respectively), and facilitate heat transfer between the catalyst and the reactor walls. Examples of materials for such essentially-inert, non-catalytic particles include, but are not limited to, sand, quartz, ceramic, metal oxides, carbides, silicas, silicides, and combinations thereof. The non-catalytic particles promote the formation of a generally uniform dispersion of the catalyst and heat in the reactor. The reactor pressure, flow path length and orientation can be varied to optimize the production of small-diameter carbon nanotubes. Suitable reactor pressures are in the range of about 0.1 and about 200 atmospheres, and suitable flow path lengths are in the range of about 1 and about 1000 feet. Preferably, the reactor is oriented vertically.

In one embodiment, the catalyst may be subjected to a separate reducing environment wherein the catalytic metal is reduced to activate the catalyst prior to being introduced to the reactor. In another embodiment, the gaseous feedstock for the carbon nanotubes, such as methane, can be used to reduce the oxide form of the catalytic metal on the catalyst to activate the catalyst in situ.

In one embodiment small-diameter carbon nanotubes are made with a catalyst in a fluidized bed reactor so that gas flows uniformly through the fluidized bed comprising the catalyst. This bed is maintained at a temperature suitable for small-diameter carbon nanotube growth and gas comprising the gaseous feedstock is passed through the catalyst to fluidize it and, at the same time, reacts on the catalyst to produce small-diameter carbon nanotubes. While the method can be used to produce small-diameter carbon nanotubes, the method could, with different catalyst compositions, reaction times and temperatures, be applied to produce large-diameter multi-wall carbon nanotubes with diameters greater than 4 nm.

Contacting the catalyst with a gas or gas mixture for the purposes of catalyst activation and carbon nanotube nucleation and growth can be done at gas pressures in the range of about 0.1 atmosphere and about 200 atmospheres. Each of the processes may be done at the same or different pressures. After contacting the catalyst with the gaseous stream containing the carbon-containing feedstock and an amount of carbon nanotubes has been formed, the gaseous carbon-containing feedstock can be turned off and the reactor cooled in a nitrogen or inert gas purge. The carbon product on the catalyst is then removed from the reactor. The carbon nanotube product forms predominantly on the surface of the catalyst, and it is often desirable in many end-uses to remove the residual catalyst from the nanotube product. As a support material, MgO is particularly desirable, not only because it produces only small amounts of extraneous carbon, but also because it can be easily removed from the final nanotube product by treatment with a mild acid. The catalyst remaining after the reaction process, including magnesium oxide and catalytic metals, can be removed by treating or mixing the carbon product comprising small-diameter carbon nanotubes and residual catalyst with an acid, such as, but not limited to, citric acid, acetic acid, nitric acid, sulfuric acid, hydrochloric acid, hydrofluoric acid and combinations thereof. Modest concentrations of these acids are effective in removing the magnesium oxide and much of the catalytic metal. Other acids of higher strength may be used at higher dilution. Suitable acids are citric acid, such as about 20 wt % aqueous citric acid, nitric acid and hydrochloric acid, of which, hydrochloric acid is preferred.

After mixing with acid to remove the particulate support, such as magnesium oxide, and catalytic metals, the carbon product is washed repeatedly with water. After washing, the purified small-diameter carbon nanotube product can be dried.

For certain applications, the nanotubes may require further purification of the small-diameter carbon nanotube product. Further purification can be done by any known means. Procedures for purification of carbon nanotubes are related in International Patent Publications "Process for Purifying Single-Wall Carbon Nanotubes and Compositions Thereof," WO 02/064,869 published Aug. 22, 2002, and "Gas Phase Process for Purifying Single-Wall Carbon Nanotubes and Compositions Thereof," WO 02/064,868 published Aug. 22, 2002, and incorporated herein in their entirety by reference. In one embodiment, the nanotubes are purified by heating at 250° C. in air saturated with water vapor. The heating is done for a length of time so as to oxidize at least some of the non-nanotube carbon, and, may, to some extent, oxidize the metal impurities. The oxidation temperature can be in the range of 200° C. and about 400° C., preferably about 200° C. to about 300° C. The oxidation can be conducted in any gaseous oxidative environment, which can comprise oxidative gases, such as oxygen, air, carbon dioxide, water vapor and combinations thereof. The choice of oxidation temperature depends on the particular oxidative gas and its concentration. The temperature range for oxidative treatment with water vapor and carbon dioxide can range from about 200° C. and about 1200° C. The concentration of the oxidative gases can be adjusted and controlled by blending them with any gas that does not react with small-diameter carbon nanotubes, such as nitrogen, an inert gas, such as argon, or combinations thereof. The duration of the oxidation process can range from a few minutes to days, depending on variables, including, but not limited to, the oxidant, its concentration, and the oxidation temperature. After heating the nanotubes in an oxidative environment, the remaining material comprising small-diameter carbon nanotubes is treated with acid to remove metallic impurities and to form a slurry of nanotubes in the acid. The acid can be a mineral acid, an organic acid, or combinations thereof. Examples of acids that could be used to treat and slurry the nanotubes include, but are not limited to, hydrochloric acid, hydrofluoric acid, hydrobromic acid, hydroiodic acid, sulfuric acid, oleum, nitric acid, citric acid, oxalic acid, chlorosulfonic acid, phosphoric acid, trifluoromethane sulfonic acid, glacial acetic acid, monobasic organic acids, dibasic organic acids, and combinations thereof. The acid used can be a pure acid or diluted with a liquid medium, such as an aqueous and/or organic solvent. Generally, an aqueous solvent is preferred. Concentrated aqueous hydrochloric acid is preferred for removing metallic impurities. After acid treating, the acid and impurities are removed from the nanotubes by rinsing. The nanotubes can be rinsed with water, an organic solvent or a combination thereof and dried. Drying can be done with or without the application of heat, either in a vacuum or a dry gas atmosphere, such as, but not limited to, nitrogen or an inert gas, such as argon.

Removal of the particulate support yields carbon nanotube particulates that comprise entangled small-diameter carbon nanotubes, wherein the carbon nanotube particulate retains approximately the same shape and size of the particulate support that was used to support the catalytic metal. The entanglement of the nanotubes in the particulates appears to be somewhat random. The size of the carbon nanotube particulate can be any size of the particulate support used to make the carbon nanotube particulates. Preferably, the particulate support typically has a cross-sectional dimension in the range of about 0.1 micron to about 1000 microns. Preferably, the cross-sectional dimension of the particulate support is less than 1000 microns, preferably less than 300 microns, preferably less than 100 microns, and preferably less than 30 microns. Depending on the reactor system used, the cross-sectional dimension of the particulate support can be less than 10 microns, less than 3 microns or less than 1 micron. For certain applications, even smaller particle sizes of between about 0.1 micron and about 1 micron may be preferable.

The desired cross-sectional dimension of the carbon nanotube particulate of the present invention is dependent on the particular end-use application. Generally, the cross-sectional dimension of the carbon nanotube particulate will be in the range of about 0.1 micron and about 1000 microns, typically in the range of about 1 micron and about 100 microns. Preferably, the cross-sectional dimension of the carbon nanotube particulate is less than 1000 microns, preferably less than 300 microns, preferably less than 100 microns, and preferably less than 30 microns. For some applications, the cross-sectional dimension of the carbon nanotube particulate is less than 10 microns, less than 3 microns, or less than 1 micron.

For even other applications, such as electrical emitters in field emission applications, the preferred cross-sectional dimension of the carbon nanotube particulate is in the range of about 0.1 micron and about 3 microns. The particulates of small-diameter carbon nanotubes contain little extraneous carbon. In one embodiment, at least about 50 wt % of the tubular carbon in the product is small-diameter carbon nanotubes. In another embodiment, at least about 80 wt % of the tubular carbon in the product is small-diameter carbon nanotubes. In yet another embodiment, at least about 90 wt % of the tubular carbon in the product is small-diameter carbon nanotubes. In yet another embodiment, at least about 95 wt % of the tubular carbon in the product is small-diameter carbon nanotubes.

Although the carbon nanotube particulates contain little extraneous carbon, annealing of the particulates will enhance their thermal stability. The annealing also extends their useful lifetime as electron emitters. Annealing of the carbon nanotube particulates can be done at temperatures up to about 1800° C. For some applications, higher annealing temperatures up to about 2000° C. may be used. The annealing is generally done in nitrogen or an inert gas such as argon. Annealing can also be done in non-oxidizing gases, such as hydrogen or carbon monoxide, diluted with nitrogen or an inert gas. The annealing time is dependent on temperature and the annealing gas, but generally is in the range of a few seconds to days, preferably 10 minutes to 1 hour. For electron emitter applications, annealed carbon nanotube particulates are preferred over unannealed carbon nanotube particulates.

The density of the carbon nanotubes in a carbon nanotube particulate is dependent on growth conditions used. The bulk density of the carbon nanotube particulates is generally in a range of about 0.01 g/cm$^3$ and about 0.5 g/cm$^3$, and typically in a range of about 0.05 g/cm$^3$ and about 0.5 g/cm$^3$. Generally, lower density is correlated with higher surface area. In one embodiment, the carbon nanotube particulate has a surface area in the range between about 100 m$^2$/g and about 1000 m$^2$/g. The carbon nanotube surface area is preferably greater than 100 m$^2$/g, preferably greater than 300 m$^2$/g, and preferably greater than 1000 m$^2$/g.

The carbon nanotube particulates can also comprise ropes of small-diameter carbon nanotubes wherein the nanotubes can be single-walled, double-walled, triple-walled, or in some cases, quadruple walled, such that the diameter of the outer wall of the nanotube is less than about 3 nm, generally in the range of about 0.5 nm and about 3 nm. Generally, the nanotube ropes have a cross-sectional dimension up to about 50 nm, depending on the number and size of the nanotubes in the rope. Typically, the cross-sectional dimension is in the range between about 10 nm and about 50 nm. The cross-sectional dimension can also be in the range between about 10 nm and about 25 nm. In another embodiment, the carbon nanotube particulate can comprise ropes with a cross-sectional dimension of less than 10 nm.

Although the small-diameter carbon nanotubes can form ropes similar to single-wall carbon nanotubes, the ropes of small-diameter carbon nanotubes comprising nanotubes with different numbers of walls are more heterogeneous and appear less crystalline (i.e. less ordered and less tightly packed) than ropes of exclusively single-wall carbon nanotubes. The heterogeneous ropes of small-diameter carbon nanotubes comprising nanotubes with different numbers of walls are less well bound by van der Waals forces, possibly due, in part to less tube-to-tube surface contact and less average flexibility and mobility of each individual tube. Such ropes of the small-diameter carbon nanotubes are easier to separate and disperse than those of pure single-wall carbon nanotubes.

Nanotube dispersability is a very desirable property, particularly in making suspensions, solutions and composites, in order to incorporate the exceptional electrical conductivity and high tensile strength of the carbon nanotubes into the composite material comprising nanotubes and a matrix material. Single-wall carbon nanotubes theoretically have much higher electrical conductivity and tensile strength compared to large multi-wall carbon nanotubes. However, the small-diameter carbon nanotubes, having up to about 4 walls, generally have very few defects and therefore also have very high electrical conductivity and high tensile strength, typically similar to those of single-wall carbon nanotubes. The small-diameter carbon nanotubes having only a few walls also exhibit spectroscopic features that are very similar to those of single-wall carbon nanotubes. Such spectral features include 'radial breathing mode' peaks in Raman spectra with Raman shifts less than about 400 cm$^{-1}$, and a Raman "G" line (at about 1582 cm$^{-1}$) that exceeds the Raman "D" line (at about 1350 cm$^{-1}$) by a factor of two or more. These spectroscopic features are, however, not observed in large-diameter (i.e. greater than 4 nm) multi-wall carbon nanotubes.

The small-diameter carbon nanotubes have the advantage of easier dispersibility without a significant loss of electrical conductivity or strength. The high porosity of the carbon nanotube particulates enhances the ease of dispersion of the particulates in other media. The nanotube particulates can be readily dispersed in liquids, such as, but not limited to, aqueous liquids (i.e., with or without surfactants), organic liquids, supercritical fluids or combinations thereof, to form suspensions. The nanotube particulates can also be dispersed in matrix media to form composites. Suitable matrix media include, but are not limited to, thermoplastic and thermoset polymers, metals, ceramics, inorganic materials, organic materials or combinations thereof. Examples of thermoplastic polymers include, but are not limited to, polyolefins, polyesters and polycarbonates. Examples of thermoset polymers include, but are not limited to, epoxies, phenolics, polysulfides and silicones. The nanotube particulates can be dispersed in the matrix media at a concentration in the range of about 0.001 wt % and about 50 wt %. Methods for dispersion include, but are not limited to, solvent blending, melt blending or a combination thereof. In one embodiment of solvent blending, the nanotube component is added to a material, such as a polymer, that is in solution. After adding the nanotube particulates to material solution, the nanotubes are dispersed by such means as mixing, sonicating, high-shear blending, vibrating, shaking, homogenizing, extruding and combinations thereof. After the nanotube component is sufficiently dispersed, the solvent is removed, resulting in a material containing dispersed nanotubes. See International Pat. Publ. WO 03/078317, "Composite Materials Comprising Polar Polymers and Single-Wall Carbon Nanotubes" published Sep. 25, 2003, which is incorporated herein by reference. In melt blending, the carbon nanotube material is combined with a polymer material and blended together in molten form with heat and high-shear mixing such as is in a single- or multiple screw extruder. The nanotube material can also be added to a molten polymer and blended in extrusion equipment, such as a single- or twin-screw extruder.

In another embodiment, the carbon nanotube particulates may also be used without blending with other media. The carbon nanotube particulates may be formed into films, mats and papers by pressing or other means of compacting.

In another embodiment of this invention, the carbon nanotubes in the carbon nanotube particulates are chemically derivatized with a functional group. Procedures disclosed in International Pat. Publ. WO 00/17101 "Chemical Derivatization of Single-wall Carbon Nanotubes", published Mar. 30, 2000, and incorporated herein by reference, are suitable for fluorinating and/or derivatizing the sidewalls of the small carbon nanotubes in the carbon nanotube particulates. The carbon nanotubes can be derivatized with one or more functional groups. The carbon nanotubes can be derivatized on their ends or sides with functional groups, such as alkyl, acyl, aryl, aralkyl, halogen; substituted or unsubstituted thiol; unsubstituted or substituted amino; hydroxy, and OR' wherein R' is selected from the group consisting of alkyl, acyl, aryl aralkyl, unsubstituted or substituted amino; substituted or unsubstituted thiol, and halogen; and a linear or cyclic carbon chain optionally interrupted with one or more heteroatom, and optionally substituted with one or more =O, or =S, hydroxy, an aminoalkyl group, an amino acid, or a peptide. Typically, the number of carbon atoms in the alkyl, acyl, aryl, aralkyl groups is in the range of 1 to about 30, or in some embodiments, in the range of 1 and about 10.

The following definitions are used herein.

The term "alkyl" as employed herein includes both straight and branched chain radicals; for example methyl, ethyl, propyl, isopropyl, butyl, t-butyl, isobutyl, pentyl, hexyl, isohexyl, heptyl, 4,4-dimethylpentyl, octyl, 2,2,4-trimethylpentyl, nonyl, decyl, undecyl, dodecyl, the various branched chain isomers thereof. The chain may be linear or cyclic, saturated or unsaturated, containing, for example, double and triple bonds. The alkyl chain may be interrupted or substituted with, for example, one or more halogen, oxygen, hydroxy, silyl, amino, or other acceptable substituents.

The term "acyl" as used herein refers to carbonyl groups of the formula —COR wherein R may be any suitable substituent such as, for example, alkyl, aryl, aralkyl, halogen; substituted or unsubstituted thiol; unsubstituted or substituted amino, unsubstituted or substituted oxygen, hydroxy, or hydrogen.

The term "aryl" as employed herein refers to monocyclic, bicyclic or tricyclic aromatic groups containing from 6 to 14 carbons in the ring portion, such as phenyl, naphthyl substituted phenyl, or substituted naphthyl, wherein the substituent on either the phenyl or naphthyl may be for example $C_{1-4}$ alkyl, halogen, $C_{1-4}$ alkoxy, hydroxy or nitro.

The term "aralkyl" as used herein refers to alkyl groups as discussed above having an aryl substituent, such as benzyl, p-nitrobenzyl, phenylethyl, diphenylmethyl and triphenylmethyl.

The term "aromatic or non-aromatic ring" as used herein are preferably 5-8 membered aromatic and non-aromatic rings uninterrupted or interrupted with one or more heteroatom, for example O, S, SO, $SO_2$, and N, or the ring may be unsubstituted or substituted with, for example, halogen, alkyl, acyl, hydroxy, aryl, and amino, said heteroatom and substituent may also be substituted with, for example, alkyl, acyl, aryl, or aralkyl.

The term "linear or cyclic" when used herein includes, for example, a linear chain which may optionally be interrupted by an aromatic or non-aromatic ring. Cyclic chain includes, for example, an aromatic or non-aromatic ring which may be connected to, for example, a carbon chain which either precedes or follows the ring.

The term "substituted amino" as used herein refers to an amino which may be substituted with one or more substituents, for example, alkyl, acyl, aryl, aralkyl, hydroxy, and hydrogen.

The term "substituted thiol" as used herein refers to a thiol which may be substituted with one or more substituents, for example, alkyl, acyl, aryl, aralkyl, hydroxy, and hydrogen.

In another embodiment of this invention, the carbon nanotube particulates wherein the carbon nanotubes have been chemically derivatized with a functional group can be readily dispersed in liquids, such as, but not limited to, aqueous liquids (i.e., with or without surfactants), organic liquids, supercritical fluids or combinations thereof, to form suspensions. The nanotube particulates wherein the carbon nanotubes have been chemically derivatized can also be dispersed in matrix media to form composites. Suitable matrix media include, but are not limited to, thermoplastic and thermoset polymers, metals, ceramics, inorganic materials, organic materials or combinations thereof. The nanotube particulates wherein the carbon nanotubes have been chemically derivatized can be dispersed in the matrix media at a concentration in the range of about 0.001 wt % and about 50 wt %. Methods for dispersion include, but are not limited to, solvent blending, melt blending or a combination thereof.

The carbon nanotube particulates are also particularly effective in electron field emission applications, such as cathode components or as cathodes in an electron tube. Such electron tubes may be amplifiers, oscillators, mixers, microwave components, discharge initiators, laser tubes, spark gaps, controlled discharge tubes, directed energy devices, display tubes, flat-panel displays and combinations thereof. In one embodiment of the present invention, the catalyst support and at least some of the metal catalyst has been separated from the carbon nanotube particulates. Preparation of field-emission materials with the particulates may, optionally, include dispersing the particulates in a viscous medium to form a carbon nanotube paste which can be deposited on a surface in a controlled manner. The depositing can be by screen printing, electrophoretic deposition, casting, ink jet printing, spraying, offset printing, or combinations thereof. The ease of dispersibility of the carbon nanotube particulates enables the formation of robust vacuum-compatible films. These deposited films serve as field-emitters of electrons when an appropriate electric field is applied to the surface comprising the particulates.

Enhancement of field emission properties of a cathode comprising the material of this invention can be achieved by "activation" procedures after it is placed on the cathode support surface. Such activation procedures include etching. The etching can be by chemical means, electrochemical means, physical means or a combination thereof. Chemical etching by strong acids or bases is effective. The acids or bases may be in the form of liquids or gases. Oxidative etching may be achieved by exposure of the cathode surface to an oxidizing gas such as ozone, atomic oxygen, at any temperature or molecular oxygen, carbon dioxide, water vapor, peroxides, or a combination thereof at elevated temperatures. The etching may also be performed by sputtering, reactive ion etching, plasma etching, and other methods known to those in the art of surface treatment.

In field emission, emission uniformity is critical. Precise control of carbon nanotube particulate size improves emission uniformity. The size range of the catalyst particle may be selected by grinding or milling the carbon nanotube particulates after they have been produced and screening the particulates to the particular desired size range. Effective methods to achieve substantial particulate uniformity of the carbon nanotube product and effectiveness in field emission characteristics includes ball milling of the carbon nanotube product and roll-milling a suspension of the product.

The following examples are included to demonstrate preferred embodiments of the invention. It should be appreciated by those of skill in the art that the techniques disclosed in the examples which follow represent techniques discovered by the inventors to function well in the practice of the invention, and thus can be considered to constitute preferred modes for its practice. However, those of skill in the art should, in light of the present disclosure, appreciate that many changes can be made in the specific embodiments which are disclosed and still obtain a like or similar result without departing from the spirit and scope of the invention.

Example 1

0.40 g iron (III) nitrate nonahydrate, ($Fe(NO_3)_3 \cdot 9H_2O$) (Mol. Wt. 404.02), 0.0365 g ammonium heptamolybdate tetrahydrate (($NH_4)_6Mo_7O_{24} \cdot 4H_2O$), 10 g magnesium nitrate hexahydrate ($Mg(NO_3)_2 \cdot 6H_2O$), and 4 g anhydrous citric acid were dissolved in a 500-ml beaker with 10 mls deionized water. As soon as a clear solution was formed, the beaker was placed in a high temperature furnace preheated at 650° C. A sudden drop in furnace temperature was observed. In a few minutes the solution foamed and a large quantity of light yellow fluffy flakes filled the beaker. The furnace temperature was reduced to 550° C. and the catalyst was held at 550° C. for 60 minutes. The catalyst was removed from the furnace and placed in a desiccator. With aid of a blender, the catalyst flakes were readily ground to fine flowing powder. The physical characteristics of the catalyst powder were small primary particle size (<5 μm) and very low bulk density (~0.1 g/cm$^3$). The chemical composition of the resulting catalyst was: 3.5 wt % Fe and 1.3 wt % Mo. In an ambient environment, the catalyst can absorb gases, such as carbon dioxide ($CO_2$) and moisture. The catalyst can lose up to about 8 wt % when heated up to about 800° C. in air.

Figure 2:
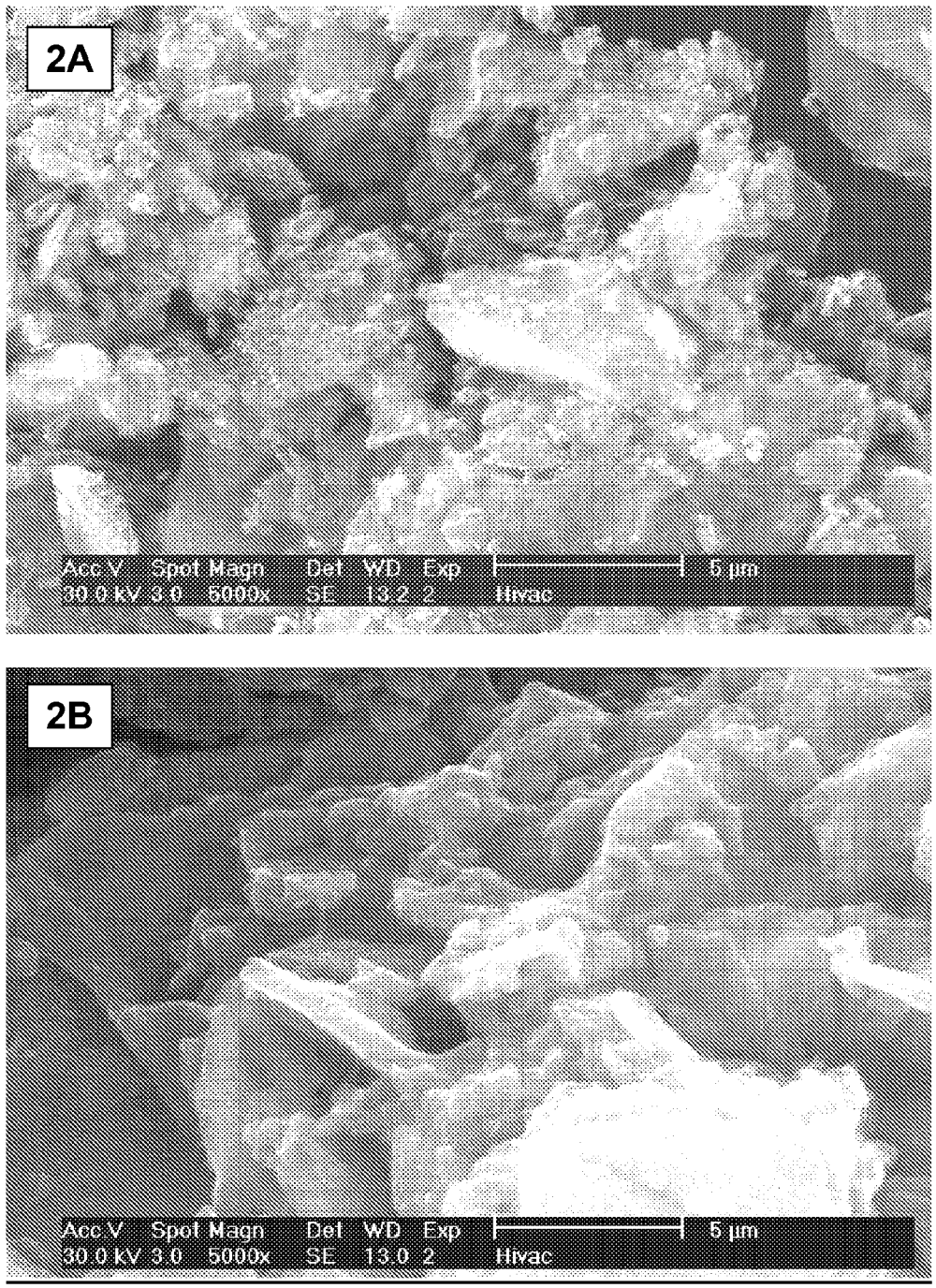
FIGS. 2A and 2B are SEMs of one embodiment of the present invention at 5000× magnification.
Figure 3:
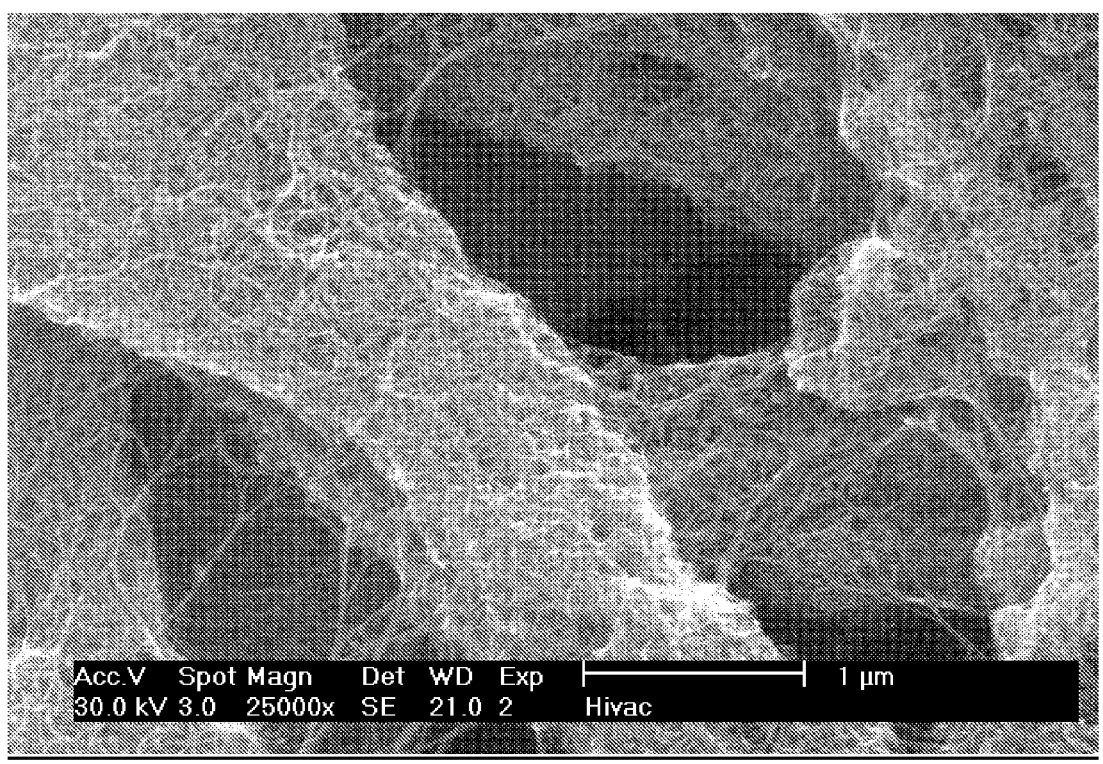
FIG. 3 is a SEM of the carbon nanotube material at 25,000× magnification after purification according to the procedure given in Example 1.

0.25 g catalyst was placed in quartz tube fitted with a quartz frit in the middle to hold the catalyst in place and operate the reactor as a fluidized bed reactor. The reactor was placed vertically in a high temperature tubular furnace. A gas control system supplied various gases from the bottom of the reactor tube. The reactor was first purged with argon gas (flow rate: 150 sccm) and the temperature increased at a rate of 20° C./min to 900° C. At 900° C., methane ($CH_4$) was turned on for 30 seconds and then turned off. The reactor was cooled to room temperature under an argon purge. The resulting material retrieved from the reactor was dark black powder. The growth of SWNT, as measured by TGA ramped to 800° C. in air, was 20.6 wt % with respect to the catalyst weight. The product was examined by scanning electron microscopy (SEM). FIGS. 1A and 2A give the SEM images at 500× and 5,000× magnifications, respectively.

The as-grown product was first oxidized in air at 300° C. for 1 hour, and then thoroughly mixed with excess of 20 wt % citric acid to remove catalyst. The citric acid-treated product was washed with water and acetone repeatedly and oven-dried at 100° C. to produce a purified product. The purified product, as analyzed by TGA, contained less than 3 wt % catalyst residue. FIGS. 1B, 2B, 3 and 4B give SEM images of the purified product at 500×, 5,000×, 25,000× and 50,000× magnifications, respectively.

Figure 4:
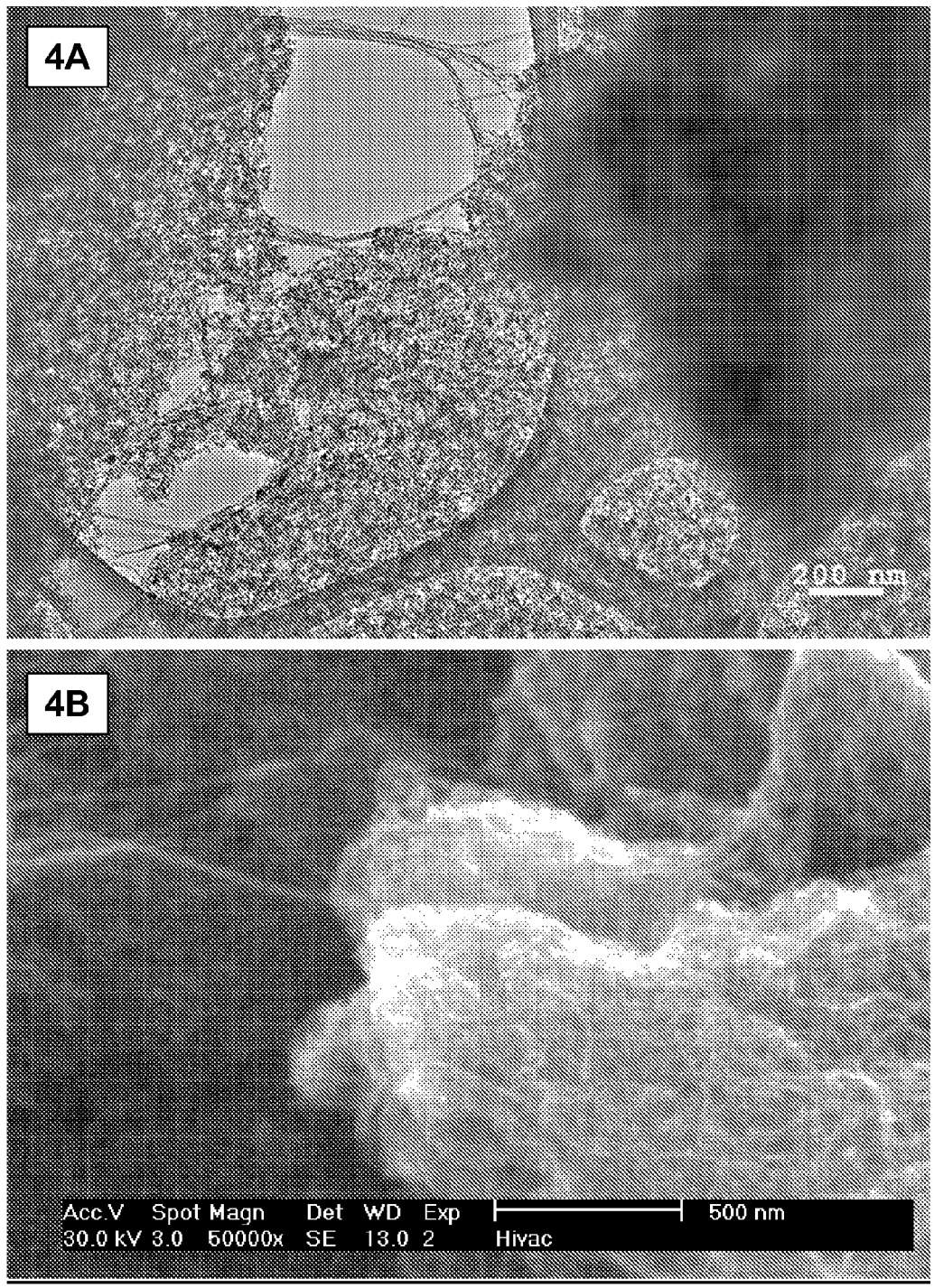
FIGS. 4A and 4B are micrographs at 50,000× magnification of acid-purified carbon nanotube particulate according to one embodiment of the present invention, prepared according to procedures in Example 1.

A few milligrams of the purified product were suspended in ethanol with ultrasonic aid. A few drops of the suspension were deposited on a lacey carbon copper grid. After the ethanol was dried, the product was examined by transmission electron microscope (JEOL JEM2010) up to 100 kV. A TEM image is shown in FIG. 4A at 50,000× magnification. Ropes of SWNT are clearly seen. Image analysis indicated that diameter of the SWNT was about 1 nm.

Example 2

This example demonstrates the production of small-diameter carbon nanotubes using the catalyst of Example 1 treated with a sulfur-containing compound.

1 g catalyst, as prepared in Example 1, was placed in a fluidized bed reactor. The reactor was purged with argon gas (flow rate: 150 sccm) and the temperature was increased at a rate of 20° C./min to 500° C. At 500° C., thiophene ($C_4H_4S$, Acros) was introduced to the catalyst by passing the argon through thiophene held at room temperature for 10 minutes. After thiophene treatment, the reactor temperature was raised to 850° C. under an argon purge. At 850° C., the argon was turned off and methane ($CH_4$, Matheson) was introduced for 10 minutes to grow nanotubes. After the 10 minutes of growth reaction, the methane was turned off and argon was turned on. The reactor was cooled to room temperature under an argon purge. The resulting material retrieved from the reactor was dark black powder. The growth of SWNT, as measured by TGA ramped to 800° C. in air, was 32.3 wt % with respect to the catalyst weight.

Scanning electron microscopy (SEM) was used to examine the as-produced material. Images clearly show the ropes of nanotubes on the surface and in the porous structure of catalyst support.

The as-grown product was thoroughly mixed with excess 20 wt % aqueous citric acid. Citric acid solutions of different concentrations, as low as about 2 wt %, were also found to be effective in removing catalyst support. The citric acid-treated product was washed with water and acetone repeatedly and oven-dried at 100° C. to give a purified carbon nanotube product, which was analyzed by TGA to contain about 4 wt % catalyst residue.

Figure 5A:
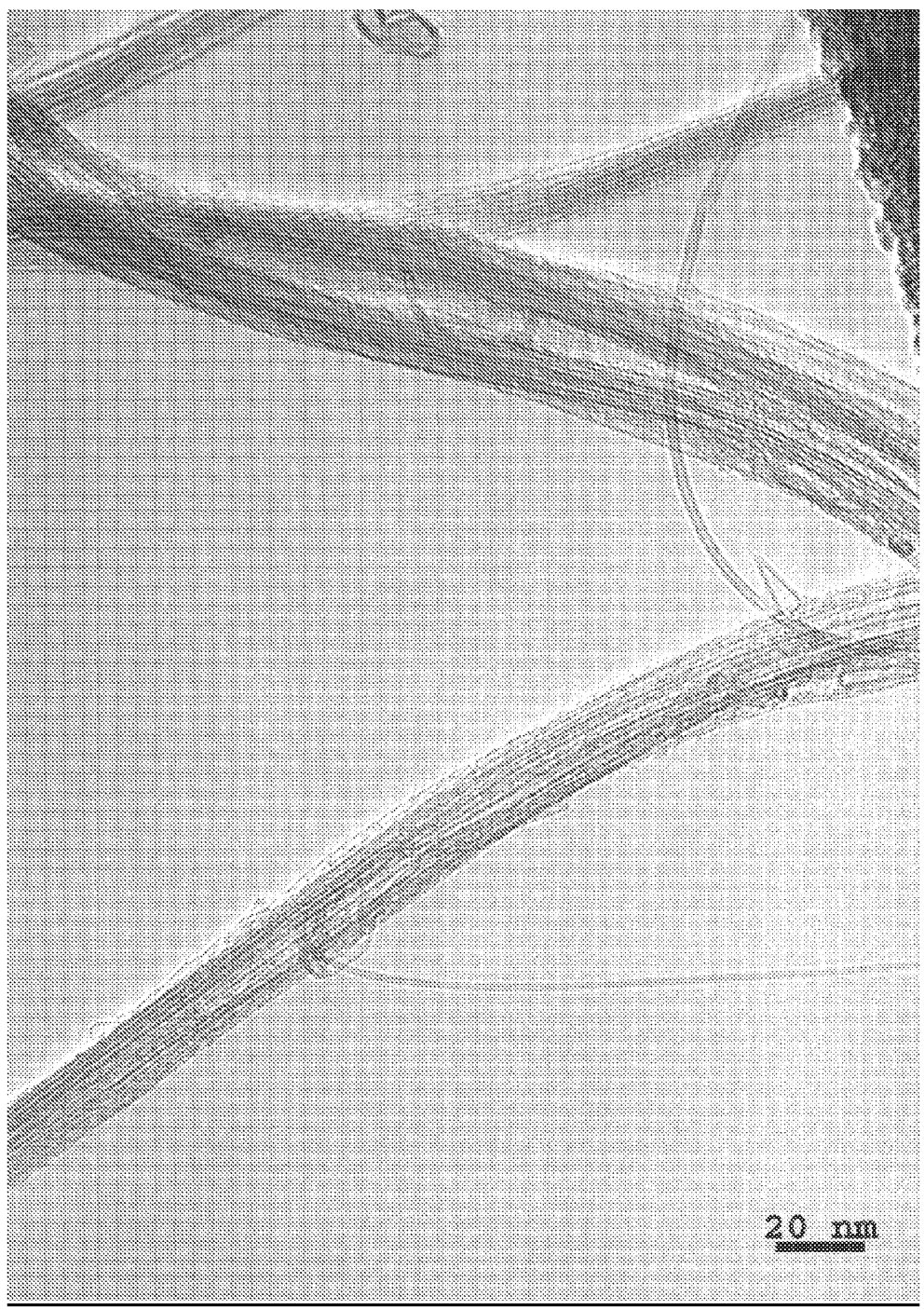
FIG. 5A shows a high-resolution TEM (~700,000× magnification) of acid-purified carbon nanotube material prepared according to Example 2 showing that the material comprises carbon nanotubes with diameters less than 3 nm.

The purified small-diameter carbon nanotube product was examined by SEM and TEM. A TEM image of the purified small-diameter carbon nanotube product is shown in FIG. 5A at about 700,000× magnification. TEM image analysis indicated that the diameter of the single-wall carbon nanotubes was about 1 nm.

Example 3

This example demonstrates the growth of small-diameter carbon nanotubes using a catalyst with a different iron and molybdenum composition. 1.1 g iron nitrate nonahydrate ($Fe(NO_3)_3 \cdot 9H_2O$), 0.028 g ammonium heptamolybdate tetrahydrate (($NH_4)_6Mo_7O_{24} \cdot 4H_2O$), 20 g magnesium nitrate hexahydrate ($Mg(NO_3)_2 \cdot 6H_2O$), and 6 g anhydrous citric acid were dissolved in 20 ml deionized water in a 500-ml beaker. The rest of the preparation procedure was identical to Example 1. The catalyst metal composition of the resulting catalyst was 4.8 wt % Fe and 0.48 wt % Mo. The physical properties were similar those of the catalyst in Example 1.

1 g catalyst was placed in a fixed fluidized bed reactor. The reactor was first purged with argon gas (flow rate: 150 sccm) and the temperature was increased at a rate of 20° C./min to 850° C. At 850° C., the argon was turned off and methane ($CH_4$) was turned on for 10 minutes and then turned off. The reactor was cooled to room temperature under an argon purge. The resulting material retrieved from the reactor was dark black powder. The growth of SWNT, as measured by TGA ramped to 800° C. in air, was 15.4 wt % with respect to the catalyst weight.

Example 4

The procedure of Example 3 was repeated except that the 10-minute growth was conducted at a temperature of 900° C. The carbon gain was 15.9 wt % with respect to catalyst weight. As-grown material was analyzed by TEM and Raman spectroscopy.

Figure 5B:
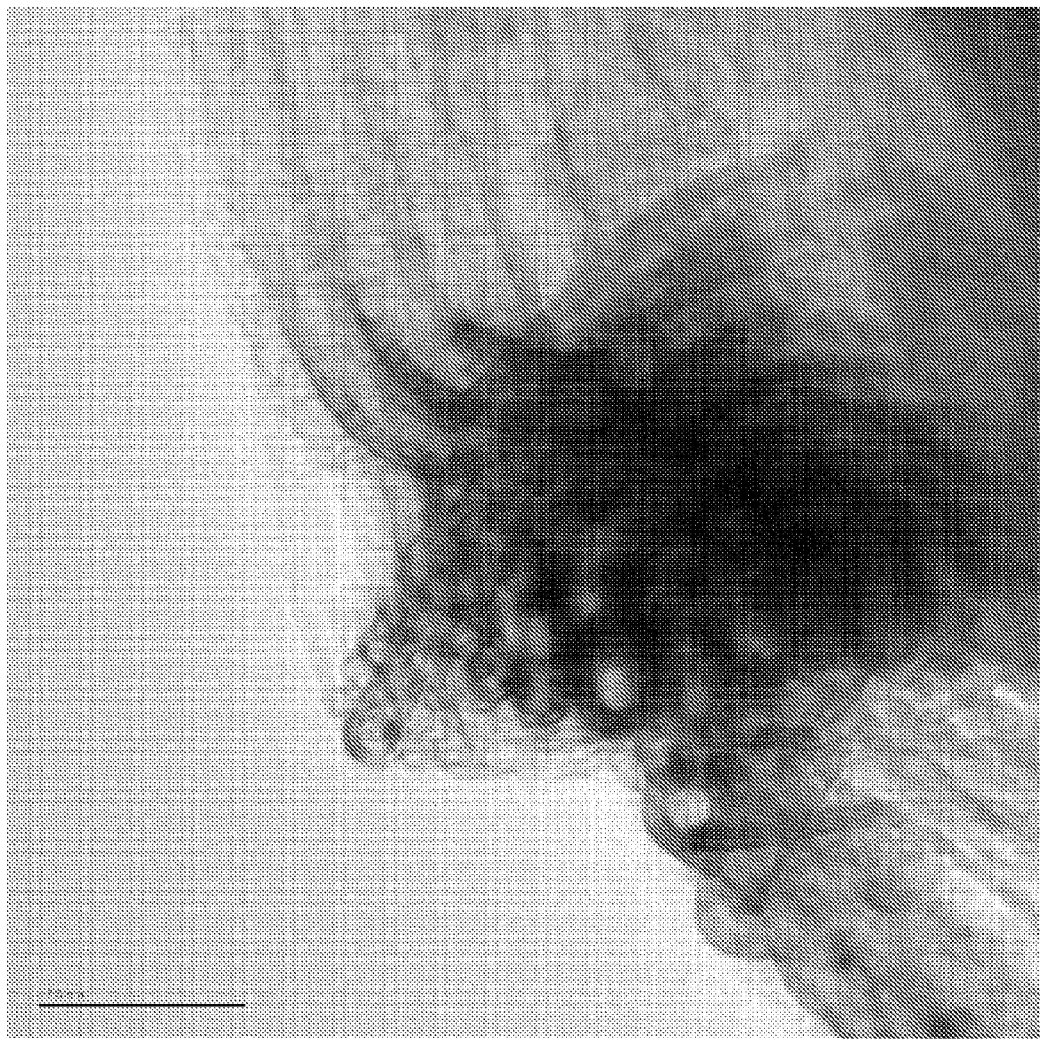
FIG. 5B shows a high resolution TEM of carbon nanotube material made according to Example 4, which shows "ropes" of small-diameter nanotubes comprising nanotubes with one and multiple walls, wherein the small-diameter nanotubes have diameters less than about 3 nm.

A high resolution TEM of carbon nanotube material made according to this example is shown in FIG. 5B. The micrograph clearly shows "ropes" of small-diameter nanotubes comprising nanotubes with one and multiple walls. The scale bar length is 7.5 nm, and the diameters of the nanotubes in the ropes shown are less than about 3 nanometers. This image was taken at the edge of a carbon nanotube particulate, wherein a portion of the rope shown lies parallel to the electron beam in the TEM. The focal plane of the TEM lies in a cross-section of the rope, and the image shown appears to be a cross section of the rope.

Figure 6A:
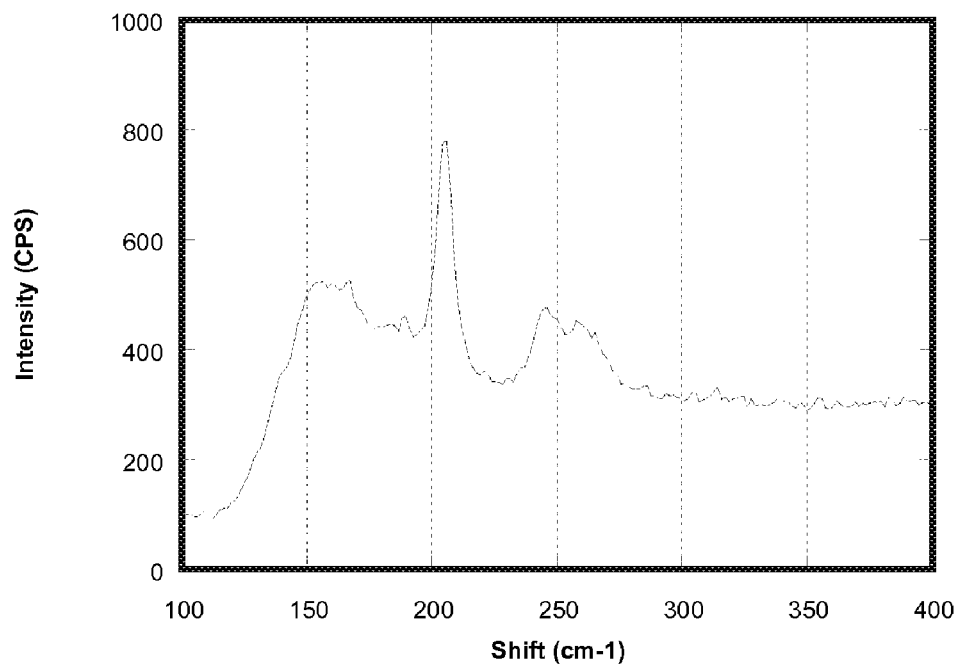
FIG. 6A shows a Raman spectrum of the RBM (Radial Breathing Mode) shifts of as-grown small-diameter carbon nanotube material prepared by the procedures of Example 4. The growth temperature was 900° C. and the excitation wavelength was 514 nm.
Figure 6B:
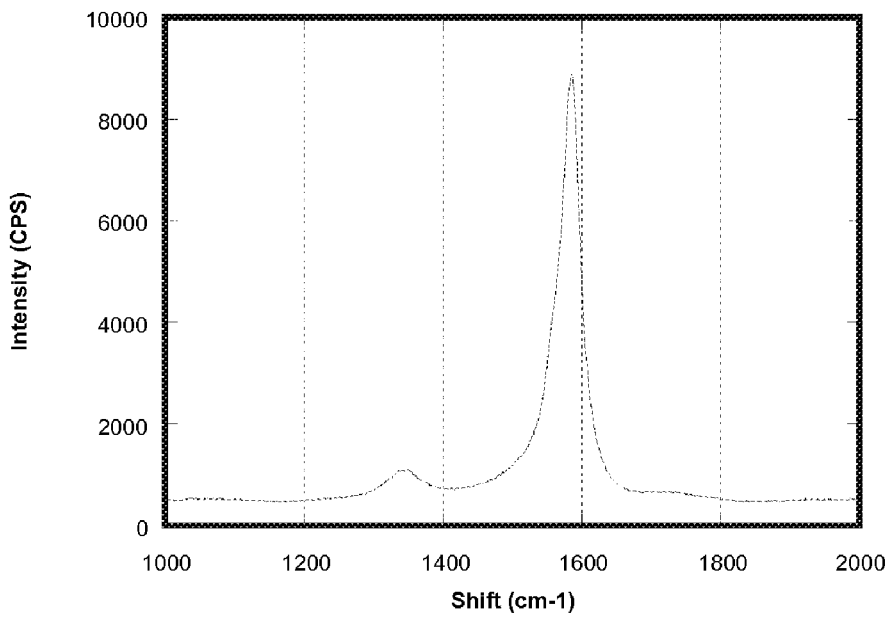
FIG. 6B shows a Raman spectrum of the tangential mode shifts of as-grown small-diameter carbon nanotube material prepared by the procedures of Example 4. The growth temperature was 900° C. and the excitation wavelength was 514 nm.

A Raman spectrum of the RBM shifts of the small-diameter carbon nanotubes in the as-grown product is shown in FIG. 6A. A Raman spectrum of the tangential mode shifts of the small-diameter carbon nanotubes in the as-grown product is shown in FIG. 6B.

Example 5

This example demonstrates the preparation small-diameter carbon nanotubes with a supported iron catalyst. 0.225 g iron nitrate nonahydrate ($Fe(NO_3)_3 \cdot 9H_2O$), 20 g magnesium nitrate hexahydrate ($Mg(NO_3)_2 \cdot 6H_2O$), and 6 g anhydrous citric acid were dissolved in 20 mls deionized water in a 500-ml beaker. The rest of the preparation procedure was identical to Example 1. The iron content of the resulting catalyst was 1.0 wt % Fe on MgO. The physical properties of the catalyst were similar to those of the catalyst in Example 1.

1 g catalyst was placed in a fluidized bed reactor. The reactor was first purged with argon gas (flow rate: 150 sccm) and the temperature was increased at a rate of 20° C./min to 850° C. At 850° C., argon was turned off and methane ($CH_4$) was turned on for 10 minutes and then turned off. The reactor was cooled to room temperature under an argon purge. The resulting material retrieved from the reactor was dark black powder. The growth of SWNT, as measured by TGA in air up to 800° C., was 7.3% wt with respect to the catalyst weight.

Figure 7A:
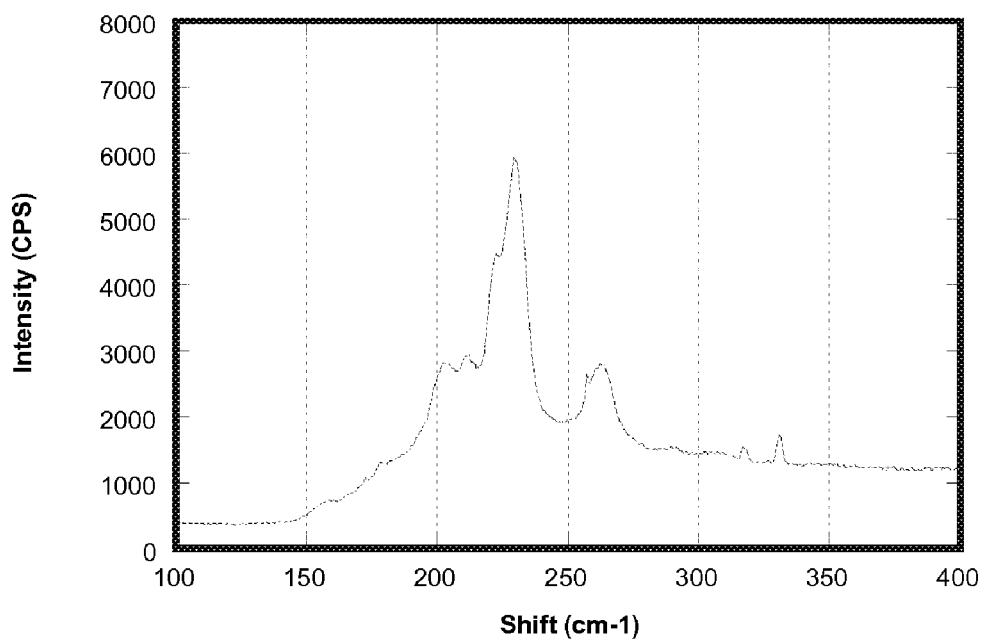
FIG. 7A shows a Raman spectrum of the RBM shifts of as-grown small-diameter carbon nanotube material prepared by the procedures of Example 5. The growth temperature was 850° C. and the excitation wavelength was 782 nm.
Figure 7B:
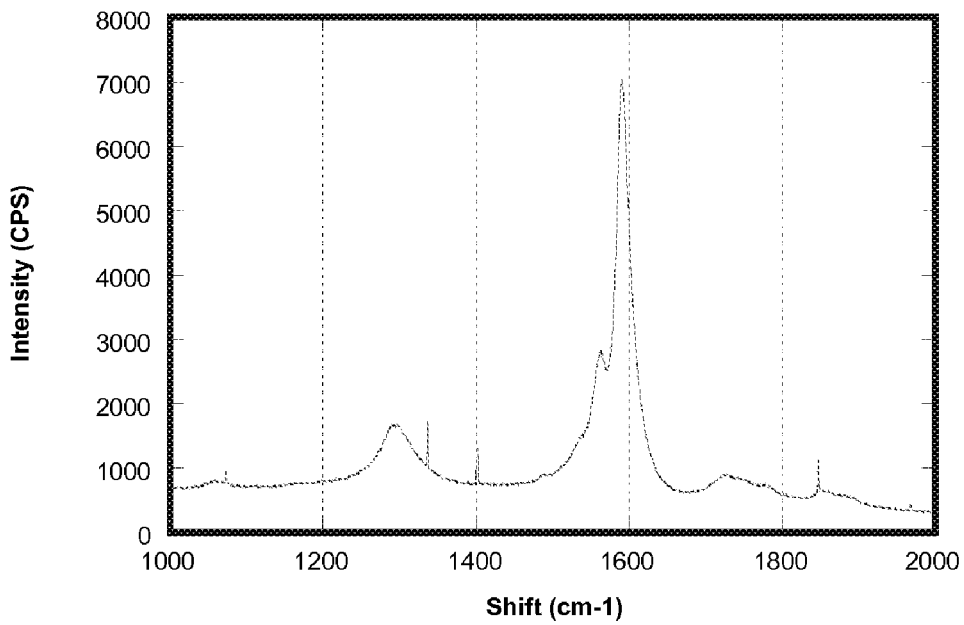
FIG. 7B shows a Raman spectrum of the tangential mode shifts of as-grown small-diameter carbon nanotube material prepared by the procedures of Example 5. The growth temperature was 850° C. and the excitation wavelength was 782 nm.

The as-grown SWNT product was analyzed by Raman spectroscopy. A Raman spectrum of the RBM shifts of the small-diameter carbon nanotubes in the as-grown product is shown in FIG. 7A. A Raman spectrum of the tangential mode shifts of the small-diameter carbon nanotubes in the as-grown product is shown in FIG. 7B.

Comparison of the radial breathing mode (RBM) peaks of FIGS. 6A and 7A indicates substantial differences in the diameter distributions produced with different catalyst compositions, wherein larger diameter nanotubes are produced when the catalyst contained a lower concentration of catalytic metal.

Example 6

Figure 8:
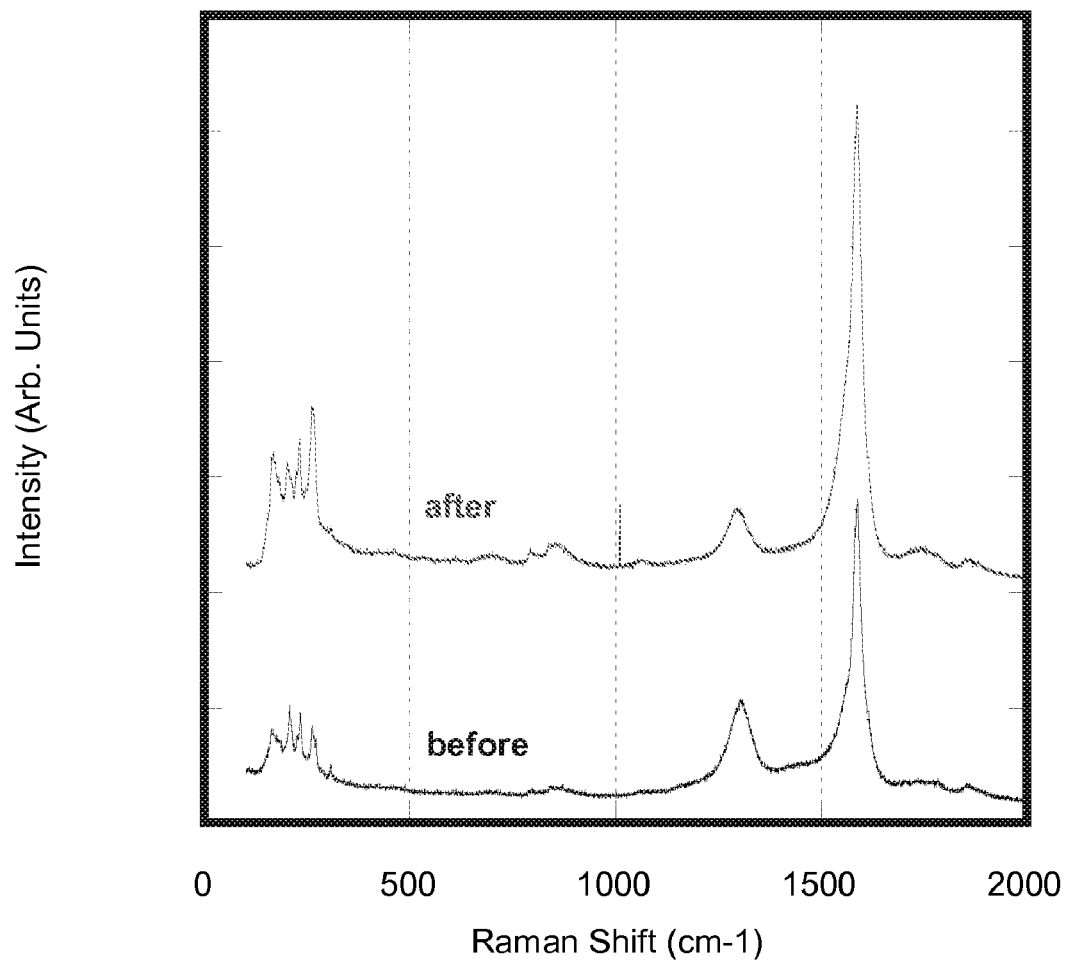
FIG. 8 gives Raman spectra of CVD-grown nanotube before and after heat treating at 1450° C. for 1 hour in argon. The carbon nanotube "radial breathing mode" features below 350 $cm^{-1}$ are enhanced by heat treatment. Laser excitation wavelength was 782 nm.
Figure 9:
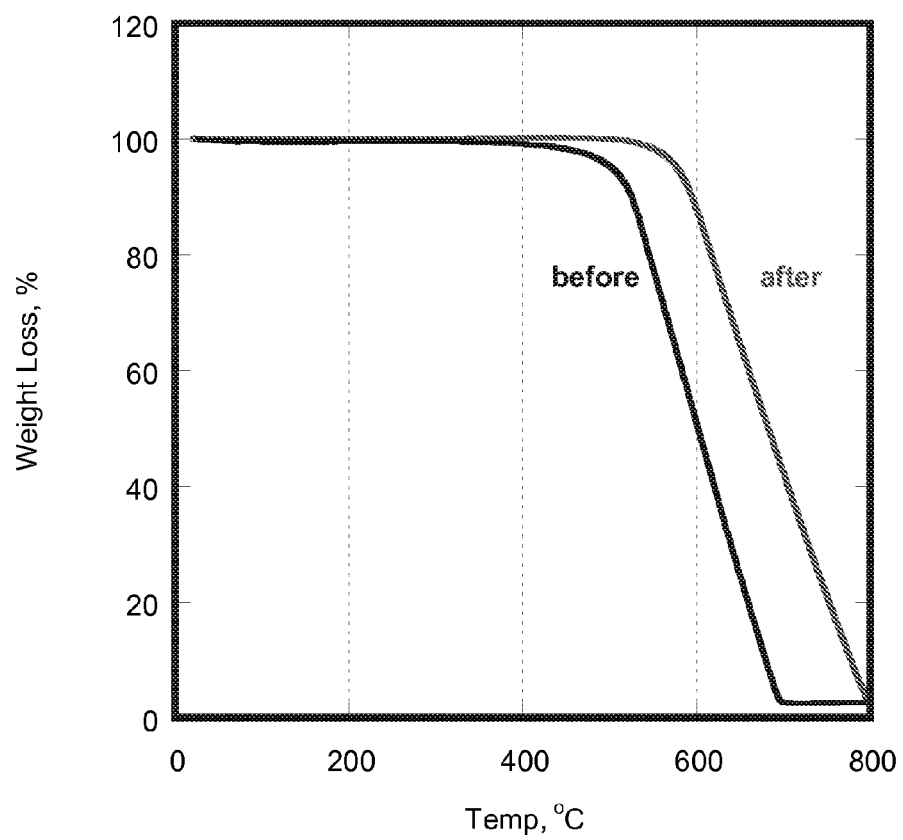
FIG. 9 shows thermogravimetric analysis (TGA) curves of the carbon nanotube material of this invention before and after heat treating at 1450° C. for 1 hour in argon. TGA conditions included air flow 10 sscm at a temperature ramp rate of 10° C./min.

Carbon nanotubes were prepared by the method of Example 1. After the carbon nanotube product was recovered, the product was heated in air at a temperature of about 300° C. for about one hour. After cooling the sample, the catalyst support and a portion of the catalyst metal was removed by mixing with aqueous HCl (about 20 wt % HCl) at room temperature for about 30 minutes. The resulting sample was rinsed with deionized water and dried. The dried sample was loaded in an alumina boat and placed in the center of the high temperature furnace tube. After purging with argon at a flow rate of 200 ml/min for 30 minutes at room temperature, the furnace temperature was ramped to 1450° C. at a rate of 15° C./min and held for 3 hours under the same argon flow. The sample was then cooled to room temperature under the same gas flow. Raman spectra before and after the annealing heat treatment are given in FIG. 8. TGA curves of the sample before and after the annealing heat treatment are presented in FIG. 9. The annealing heat treatment increased the burn temperature of the carbon nanotube sample by about 100° C. compared to the unannealed sample.

Example 7

This example compares the direct melt blending of carbon nanotube particulates prepared according to Example 3 above with HIPCO® single-wall carbon nanotubes obtained from Carbon Nanotechnologies, Inc. (HIPCO is a trademark registered to Carbon Nanotechnologies, Incorporated, Houston, Tex.). 5.0 wt % nanotube/poly-carbonate blends were prepare by blending two grams of each nanotube material with 38 g polycarbonate powder (LEXAN® HF1110 polycarbonate resin from GE Plastics. LEXAN is a registered trademark of the General Electric Company.). Blending was done for 10 minutes at 275° C. in a Plasti-corder twin-screw mixer (C.W. Brabender Instruments, Inc.). Each nanotube/polycarbonate composite blend was pressed into a sheet approximately 0.5 mm thick. The electrical conductivity of each sheet was determined using 4-point probe resistivity/conductivity measurements using a Keithley Model 2400 SourceMeter as the current source and voltmeter. The conductivity of the HIPCO/polycarbonate composite was 0.0452 Siemens/centimeter (S/cm), while the conductivity of the composite of the material of the polycarbonate composite made with carbon nanotube particulates of this invention was 0.0964 S/cm.

Subsequently, each of the blended composites was mixed with additional polycarbonate in the same twin-screw mixer to produce composites with lower nanotube loadings, namely, 1.0 wt % and 0.5 wt % nanotube material in polycarbonate. The electrical conductivities of the 1.0 wt % and 0.5 wt % HIPCO/polycarbonate composites were $3.84 \times 10^{-4}$ S/cm and $1.46 \times 10^{-7}$ S/cm, respectively. The conductivities of the polycarbonate composites made with 1 wt % and 0.5 wt % carbon nanotube particulates of this invention were $5.09 \times 10^{-3}$ S/cm and $8.14 \times 10^{-4}$ S/cm, respectively. The results are shown in Table 1. In comparison, the carbon nanotube particulates of the present invention showed significantly higher electrical conductivity than single-wall carbon nanotubes at the same nanotube loading levels. The higher conductivity is especially pronounced at low loadings of less than 1 wt %.

TABLE 1

Conductivity of the Composites of Polycarbonate and Carbon Nanotubes

| Loading of carbon nanotubes in polycarbonate (wt %) | Conductivity with carbon nanotube particulates (S/cm) | Conductivity with HIPCO SWNT (S/cm) |
|---|---|---|
| 0.5 | $8.14 \times 10^{-4}$ | $1.46 \times 10^{-7}$ |
| 1.0 | $5.09 \times 10^{-3}$ | $3.84 \times 10^{-4}$ |
| 5.0 | $9.64 \times 10^{-2}$ | $4.52 \times 10^{-2}$ |

Example 8

This example compares carbon FIBRIL™ nanotubes (FIBRIL is a trademark of Hyperion Catalysis International, Cambridge, Mass.) with the carbon nanotube particulates of the present invention. Carbon FIBRIL nanotubes commonly have diameters between 20 and 60 nm and can be used as a polymer additive for electrical conductivity.

The electrical conductivities of compositions containing FIBRIL nanotubes and carbon nanotube particulates of the present invention, both prepared according to the procedures of Example 7, were determined using 4-point probe resistivity/conductivity measurements using a Keithley Model 2400 SourceMeter as the current source and voltmeter. The electrical conductivities are compared in Table 2 below. At the same loading levels, the carbon nanotube particulates of the present invention provided greater electrical conductivity in polycarbonate than FIBRIL nanotubes.

This data shows that carbon nanotube particulates of this invention provide higher electrical conductivity for a giving loading level. At very low loadings, such as 0.5 wt %, the carbon nanotube particulates of this invention provides a measurable conductivity to the polycarbonate composite versus no measurable conductivity at the 0.5 wt % loading level of carbon FIBRIL nanotubes.

TABLE 2

Conductivity of the Composites of Polycarbonate and Carbon Nanotubes

| Loading of carbon nanotubes in polycarbonate (wt %) | Conductivity with carbon nanotube particulates (S/cm) | Conductivity with carbon FIBRIL nanotubes (S/cm) |
|---|---|---|
| 0.5 | $7.87 \times 10^{-4}$ | None |
| 1.0 | $6.51 \times 10^{-3}$ | $3.96 \times 10^{-7}$ |
| 2.5 | $2.86 \times 10^{-2}$ | $2.08 \times 10^{-3}$ |
| 5 | $9.14 \times 10^{-2}$ | $8.52 \times 10^{-2}$ |

Example 9

This example demonstrates the sidewall fluorination of the small-diameter carbon nanotubes in the carbon nanotube particulates of the present invention. Purified carbon nanotubes particulates were exposed to a mixture of 10% fluorine and 90% argon in a tubular furnace. The temperature was increased from 30° C. to 250° C. over 30 minutes and then maintained at 250° C. for 90 minutes. The furnace was cooled to room temperature and the carbon nanotube material was removed. The mass of the sample was measured and found to have increased by approximately 10%, indicating partial sidewall fluorination of the carbon nanotube particulates.

Example 10

Carbon nanotubes made by different processes and subjected to different treatments were tested as electrical emitters. The carbon nanotube samples included in this example are as follows:

Sample 101: Carbon nanotube particulates of the present invention were made according to procedures given in Example 4 and purified by heating in air at 300° C. for 1 hour followed by mixing in an aqueous solution of 20 wt % HCl for 30 min at room temperature. The sample was annealed at 1450° C. for 1 hr in argon. Residual metal content was 4.5 wt %.

Sample 102: Carbon nanotube particulates of the present invention were made according to procedures given in Example 4 and purified by heating in air at 300° C. for 1 hour followed by mixing in an aqueous solution of 20 wt % HCl for 30 min at room temperature. The sample was not annealed. Residual metal content was 3.8 wt %.

Sample 103: Single-wall carbon nanotubes made by the laser oven process. The single-wall carbon nanotube sample was made by Carbon Nanotechnologies, Inc. using procedures given in U.S. Pat. No. 6,183,714, "Method of Making Ropes of Single-Wall Carbon Nanotubes", issued Feb. 6, 2001. The nanotubes were prepared using a Ni/Co catalyst and double Nd:YAG lasers. The sample was used "as-prepared" and not purified or annealed. Residual metal content was 8.0 wt %.

Sample 104: HIPCO single-wall carbon nanotubes made by Carbon Nanotechnologies, Inc. using procedures given in "Gas phase nucleation and growth of single-wall carbon nanotubes from high pressure carbon monoxide", Int. Pat. Publ. WO 00/26138 published May 11, 2000. The sample was purified by heating in moist air at 250° C. for 1 hr followed by mixing in 20 wt % aqueous HCl for 1 hour at room temperature. The sample was annealed at 1450° C. for 1 hr in argon. Residual metal content was 3.0 wt %.

Sample 105: HIPCO single-wall carbon nanotubes made by Carbon Nanotechnologies, Inc. using procedures given in "Gas phase nucleation and growth of single-wall carbon nanotubes from high pressure carbon monoxide", Int. Pat. Publ. WO 00/26138 published May 11, 2000. The sample was purified by heating in moist air at 250° C. for 1 hr followed by mixing in 20 wt % aqueous HCl for 1 hour at room temperature. The sample was not annealed. Residual metal content was 10.0 wt %.

After preparation and any additional treating procedures, each nanotube sample was sonicated in toluene to form a slurry. Each nanotube slurry was deposited on a conducting gold-coated silicon substrate and the toluene was evaporated to form a nanotube film. The nanotube film samples were tested as electrical emitters according to the following test procedures.

A 1.1-mm-diameter optically smooth platinum sphere was used as the anode and positioned precisely with a scanning tunneling microscopy (STM) system having a piezoelectric inch-worm motor. The inch-worm system was housed in an ultrahigh vacuum (UHV) chamber. The Pt anode and nanotube film samples were loaded onto the inchworm and sample holder, respectively, and the system was operated in STM mode. The gap between the anode and the nanotube film was reduced until tunneling occurred at an anode-to-sample distance d=0.5-1.0 nm. The anode was then retracted to a distance of 250 µm, at which the field emission current versus electrical field was measured.

Figure 10:
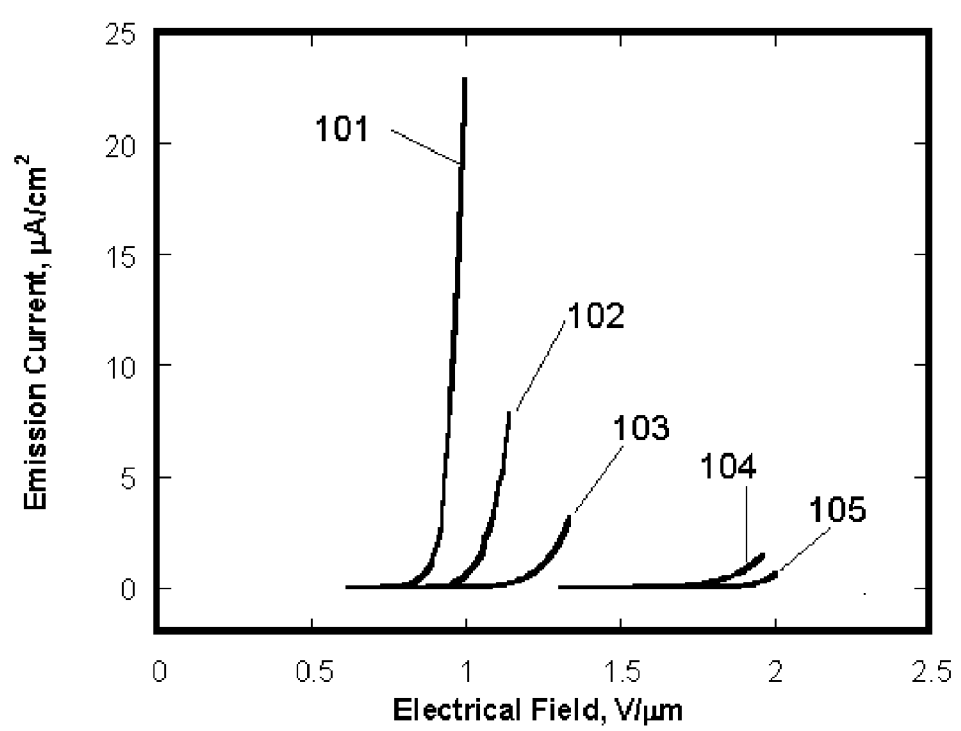
FIG. 10 shows a plot of field emission current versus electric field for various carbon nanotube materials. The electron emitter characteristics are given by sample curve 101 for carbon nanotube particulates of one embodiment of the present invention; by sample curve 102 for annealed carbon nanotube particulates of one embodiment of the present invention; by sample curve 103 for as-produced single-wall carbon nanotube material made by laser oven procedures; by sample curve 104 for purified HIPCO® single-wall carbon nanotube material and by sample curve 105 for purified and annealed HIPCO® single-wall carbon nanotube material. Per curves 101 and 102, the present invention establishes electron emission at the lowest threshold electric fields.

Plots of field emission current density versus electrical field are shown in FIG. 10. The annealed carbon nanotube particulates of the present invention showed the highest emission current density at the lowest "turn-on" emission field. The "turn-on" emission field for each different nanotube sample at a current density of about 0.1 µA/cm$^2$ current density is given in Table 3. Low "turn-on" emission field is desired and was lowest, at about 0.85 V/µm for the annealed carbon nanotube particulates of the present invention. For emitter applications, a carbon nanotube particulate of a size in the range of about 0.1 micron and about 3 microns is preferred.

TABLE 3

Electrical Emission of Carbon Nanotube Samples

| Sample Number | Sample Description and Treatment | Purification conditions | Annealing conditions | Residual metal content (wt %) | Turn-on Electrical Field (V/gm) |
|---|---|---|---|---|---|
| 101 | Carbon nanotube particulates of the present invention - purified and annealed | Heated in dry air at 300° C. for 1 hr followed by mixing in 20 wt % $HCl_{(aq)}$ for 30 min at RT | 1450° C. for 1 hr in argon | 4.5% | 0.85 |
| 102 | Carbon nanotube particulates of the present invention - purified, not annealed | Heated in dry air at 300° C. for 1 hr followed by mixing in 20 wt % $HCl_{(aq)}$ for 30 min at RT | Not annealed | 3.8% | 0.98 |
| 103 | Single-wall carbon nanotubes by the laser oven process - as-produced | Not purified | Not annealed | 8.0% | 1.15 |
| 104 | HIPCO single-wall carbon nanotubes - purified and annealed | Heated in moist air at 250° C. for 1 hr followed by mixing in 20 wt % $HCl_{(aq)}$ for 1 hr at RT | 1450° C. for 1 hr in argon | 3.0% | 1.81 |
| 105 | HIPCO single-wall carbon nanotubes - purified, not annealed | Heated in moist air at 250° C. for 1 hr followed by mixing in 20 wt % $HCl_{(aq)}$ for 1 hr at RT | Not annealed | 10.0% | 1.95 |

All of the compositions and methods disclosed and claimed herein can be made and executed without undue experimentation in light of the present disclosure. While the compositions and methods of this invention have been described in terms of preferred embodiments, it will be apparent to those of skill in the art that variations may be applied to the compositions and methods and in the steps or in the sequence of steps of the method described herein without departing from the concept, spirit and scope of the invention. More specifically, it will be apparent that certain agents which are chemically related may be substituted for the agents described herein while the same or similar results would be achieved. All such similar substitutes and modifications apparent to those skilled in the art are deemed to be within the spirit, scope and concept of the invention as defined by the appended claims.

What is claimed is:

1. A carbon nanotube rope comprising a carbon nanotube with at least three walls, wherein the rope has a cross-sectional dimension of less than about 10 nm.

2. The carbon nanotube rope of claim 1, wherein the carbon nanotube has an outer wall having a diameter of less than about 3 nm.

3. A carbon nanotube rope comprising a carbon nanotube with at least three walls, wherein the rope has a cross-sectional dimension in the range of about 10 nm and about 50 nm.

4. The carbon nanotube rope of claim 3, wherein the carbon nanotube has an outer wall having a diameter of less than about 3 nm.

5. A carbon nanotube rope comprising a carbon nanotube with at least four walls, wherein the rope has a cross-sectional dimension of less than about 10 nm.

6. The carbon nanotube rope of claim 5, wherein the carbon nanotube has an outer wall having a diameter of less than about 3 nm.

7. A carbon nanotube rope comprising a carbon nanotube with at least four walls, wherein the rope has a cross-sectional dimension in the range of about 10 nm and about 50 nm.

8. The carbon nanotube rope of claim 7, wherein the carbon nanotube has an outer wall having a diameter of less than about 3 nm.

* * * * *